(12) United States Patent
Tamiya

(10) Patent No.: US 7,933,023 B2
(45) Date of Patent: Apr. 26, 2011

(54) DISPLACEMENT DETECTION APPARATUS, DISPLACEMENT MEASUREMENT APPARATUS AND FIXED POINT DETECTION APPARATUS

(75) Inventor: Hideaki Tamiya, Kanagawa (JP)

(73) Assignee: Mori Seiki, Co., Ltd., Nara (JP)

( * ) Notice: Subject to any disclaimer, the term of this patent is extended or adjusted under 35 U.S.C. 154(b) by 0 days.

(21) Appl. No.: 11/438,114

(22) Filed: May 19, 2006

(65) Prior Publication Data

US 2006/0279747 A1      Dec. 14, 2006

(30) Foreign Application Priority Data

May 23, 2005   (JP) .................................. 2005-150227

(51) Int. Cl.
*G01B 9/02*   (2006.01)
(52) U.S. Cl. .................................................... 356/494
(58) Field of Classification Search .................. 356/494, 356/488, 499; 250/231.14, 231.16
See application file for complete search history.

(56) References Cited

U.S. PATENT DOCUMENTS

| | | | | |
|---|---|---|---|---|
| 4,447,117 A | * | 5/1984 | Bobb ........................ | 250/227.11 |
| 4,948,251 A | * | 8/1990 | Kondo ........................ | 356/487 |
| 5,038,032 A | * | 8/1991 | Nishimura et al. ...... | 250/231.16 |
| 5,245,407 A | * | 9/1993 | Nishiura et al. ............... | 356/460 |
| 5,459,570 A | * | 10/1995 | Swanson et al. ............... | 356/479 |

FOREIGN PATENT DOCUMENTS

| | | | |
|---|---|---|---|
| EP | 539757 A1 | * | 5/1993 |
| JP | 2005283358 A | * | 10/2005 |

* cited by examiner

*Primary Examiner* — Tarifur Chowdhury
*Assistant Examiner* — Jonathan D Cook
(74) *Attorney, Agent, or Firm* — Robert J. Depke; Rockey, Depke & Lyons, LLC

(57) ABSTRACT

A displacement detection apparatus includes a light source for emitting light and an extinction ratio conversion element which raises an extinction ratio of the light to 20 dB or more. A condenser lens condenses the light having the increased extinction ratio and a polarization maintaining type optical fiber transmits the condensed light which is subsequently transferred to a diffraction grating that is attached to an object to be measured. The displacement detection apparatus adjusts a polarization axis of the light having increased extinction ratio.

4 Claims, 17 Drawing Sheets

DISPLACEMENT DETECTION APPARATUS, DISPLACEMENT MEASUREMENT APPARATUS AND FIXED POINT DETECTION APPARATUS

CROSS REFERENCES TO RELATED APPLICATIONS

The present document contains subject matter related to Japanese Patent Application JP 2005-150227 filed in the Japanese Patent Office on May 23, 2005, the entire contents of which being incorporated herein by reference.

BACKGROUND OF THE INVENTION

1. Field of the Invention

The present invention relates to a displacement detection apparatus which detects a displacement by detecting a light diffracted by a diffraction grating, a displacement measurement apparatus which measures the amount of displacement using an interference of the lights diffracted by diffraction gratings, and a fixed point detection apparatus which acquires a fixed point by means of the diffracted lights.

2. Description of the Related Art

In the past, there has been a grating interferometer as a detector which detects a displacement of the position of a diffraction grating attached onto a moving scale by using the interference of lights. In the following, a displacement detection apparatus is described with reference to FIG. 18. It is noted that FIG. 18 shows a displacement detection apparatus using a transmission grating.

As shown in FIG. 18, the displacement detection apparatus is equipped with a coherent light source unit 90, a first lens 91, a first polarization beam splitter (PBS) 92, a first quarter wavelength plate 93, a reflecting prism 94, a second quarter wavelength plate 95, a second lens 96, a beam splitter (BS) 97, a second PBS 98, a first photoelectric transducer 99, a second photoelectric transducer 100, a third quarter wavelength plate 101, a third PBS 102, a third photoelectric transducer 103, a fourth photoelectric transducer 104, a first differential amplifier 105, a second differential amplifier 106 and an incremental signal generator 107. The displacement detection apparatus reads a transmission grating disposed on a scale 108.

The coherent light source unit 90 emits a light to the first lens 91. The first lens 91 narrows down the entered light into a suitable beam, and emits the beam to the first PBS 92. The first PBS 92 divides the entered light into two lights, a light having an S polarization component and a light having a P polarization component. The S polarization component is a polarization component oscillates perpendicular to an incident plane composed of a light entering a boundary surface of lights and a light reflected by the boundary surface. Moreover, the P polarization component is a polarization component performing vibrations horizontal to the incident plane. The light having the S polarization component is reflected by the first PBS 92, and the light which has the P polarization component is transmitted through the first PBS 92. It is noted that, if the light from the coherent light source unit 90 is the linearly polarized light, the light is entered into the first PBS 92 with the polarization direction thereof inclined by 45 degrees. Herewith, the intensity of the light of the S polarization component and the intensity of the light of the P polarization component can be made equal to each other.

The light having the S polarization component, which has reflected by the first PBS 92, enters a point P of the diffraction grating recorded on the scale 108. Moreover, the light having the P polarization component, which has transmitted through the first PBS 92, enters a point Q of the diffraction grating. Each of the lights is diffracted into the direction expressed by the following formula.

$$\sin\theta_1 + \sin\theta_2 = n\cdot\lambda/\Lambda$$

where $\theta_1$ denotes an incident angle onto the scale 108; $\theta_2$ denotes the angle of diffraction from the scale 108; $\Lambda$ denotes the pitch (width) of the lattice; $\lambda$ denotes the wavelength of the light; and n denotes a diffraction order.

If the following marks are supposed to each of the following factors: $\theta_1 p$ to an incident angle into the point P; $\theta_2 p$ to the angle of the diffraction at the point P; $\theta_1 q$ to an incident angle into the point Q; and $\theta_2 q$ to the angle of the diffraction at the point Q, then the related art displacement detection apparatus shown in FIG. 18 adjusts $\theta_1 p$, $\theta_2 p$, $\theta_1 q$ and $\theta_2 q$ so as to be $\theta_1 p = \theta_2 p = \theta_1 q = \theta_2 q$. Moreover, the diffraction orders at the points P and Q are the same orders.

The light (S polarization component) having been diffracted at the point P passes through the first quarter wavelength plate 93, and is perpendicularly reflected by the reflecting prism 94. Then, the reflected light again returns to the point P to be diffracted by the diffraction grating. Because the optical axis of the first quarter wavelength plate 93 is inclined to the polarization direction of the entered light by 45 degrees at this time, the light having returned to the point P is changed to the light of the P polarization component.

Moreover, the light (P polarization component) having been diffracted at the point Q similarly passes through the second quarter wavelength plate 95, and is perpendicularly reflected-by the reflecting prism 94. Then, the reflected light again returns to the point Q to be diffracted by the diffraction grating. Because the optical axis of the second quarter wavelength plate 95 is inclined to the polarization direction of the entered light by 45 degrees at this time, the light having returned to the point Q has been changed to the light of the S polarization component.

The lights diffracted again at the points P and Q in this manner return to the first PBS 92. Because the light which has returned from the point P has the P polarization component, the light passes through the first PBS 92. Moreover, because the light which has returned from the point Q has the S polarization component, the light is reflected by the first PBS 92. Consequently, the lights which have returned from the points P and Q are superposed by the first PBS 92, and are narrowed down to a suitable beam by the second lens 96 to enter the BS 97.

The BS 97 divides the entered light into two lights. Then, the BS 97 enters one light into the second PBS 98, and enters the other light into the third quarter wavelength plate 101. Note that the second PBS 98 and the third quarter wavelength plate 101 are severally inclined to the polarization direction of the entering light by 45 degrees.

The light having entered the second PBS 98 is divided into a light having the S polarization component and a light having the P polarization component. The light having the S polarization component is entered into the first photoelectric transducer 99, and the light having the P polarization component is entered into the second photoelectric transducer 100. Moreover, an interference signal of $A\cos(4Kx+\delta)$ is acquired in the first photoelectric transducer 99 and the second photoelectric transducer 100, where K denotes $2\pi/\Lambda$; x denotes a movement quantity; and $\delta$ denotes an initial phase. Moreover, in the first photoelectric transducer 99, a signal having a phase different from that in the second photoelectric transducer 100 by 180 degrees is acquired.

Moreover, a light which has entered the third quarter wavelength plate 101 is changed into a light having the P polarization component and a light having the S polarization component, both being mutually reversed to circularly polarized lights, and then the circularly polarized lights are superposed on each other to become a linearly polarized light. Then, the linearly polarized light enters the third PBS 102. The light having entered the third PBS 102 is divided into a light having the S polarization component and a light having the P polarization component. The light having the S polarization component is entered into the third photoelectric transducer 103, and the light having the P polarization component is entered into the fourth photoelectric transducer 104. It is noted that the polarization direction of the linearly polarized light entering the third PBS 102 makes one revolution when the diffraction grating moves into the x direction by Λ/2. Consequently, the third photoelectric transducer 103 and the fourth photoelectric transducer 104 can acquire an interference signal of Acos(4Kx+δ') in common with the first photoelectric transducer 99 and the second photoelectric transducer 100. Moreover, in the third photoelectric transducer 103, a signal of a phase different from that of the fourth photoelectric transducer 104 by 180 degrees is acquired.

In addition, the third PBS 102 is inclined to the second PBS 98 by 45 degrees. Consequently, the signals acquired by the third photoelectric transducer 103 and the fourth photoelectric transducer 104 differ from the signals acquired by the first photoelectric transducer 99 and the second photoelectric transducer 100 in phase by 90 degrees.

The first differential amplifier 105 performs the differential amplification of the electric signals input from the first photoelectric transducer 99 and the second photoelectric transducer 100, and outputs a signal acquired by cancelling the direct current (DC) component of the interference signal to the incremental signal generator 107. Moreover, also the second differential amplifier 106 similarly performs the differential amplification of the electric signals input from the third photoelectric transducer 103 and the fourth photoelectric transducer 104, and outputs a signal acquired by cancelling the direct current (DC) component of the interference signal to the incremental signal generator 107.

Next, FIG. 19 shows an example of a related art fixed point detection apparatus disclosed in Published Unexamined Japanese Patent Application No. Hei 4-324316, filed by the present applicant. The fixed point detection apparatus includes a fixed unit 110 and a movable unit 130 movable along a measurement direction (X direction). The fixed unit 110 includes an optical system 111 and a detection system 121, and the movable unit 130 includes a substrate 131 and two volume type holographic diffraction gratings 132 and 133 disposed on the top face of the substrate 131.

The optical system 111 includes a light source 112 such as a semiconductor laser or the like, which outputs a laser light, a collimator lens 113 and a condenser lens 114. The detection system 121 includes two photo-receivers 122 and 123 and electric processing circuit 129.

The holographic diffraction gratings 132 and 133 used for this example are shown in FIG. 20. The holographic diffraction gratings 132 and 133 are severally formed of a volume type hologram of a transmission type. In the following, the holographic diffraction gratings 132 and 133 are simply called as holograms on occasion. As shown in FIG. 20, the grating interval, or a grating pitch d, of each of the holograms 132 and 133 sequentially and continuously changes in the measurement direction. Moreover, distribution surfaces 142 and 143, on which the grating interval or the grating pitch d, of each of the holograms 132 and 133 is severally formed, are inclined to the top faces of the holograms 132 and 133, and the angles of the inclinations sequentially and continuously change in the measurement direction. If an incidence light is diffracted by each of the holograms 132 and 133, the diffraction efficiency of the incident light continuously changes in the measurement direction.

FIG. 21 shows the principal part of the fixed point detection apparatus of FIG. 20. As shown in FIG. 21, the two holograms 132 and 133 are mutually disposed to adjoin in a lateral direction on the top face 131A of the substrate 131. These two holograms 132 and 133 are mutually configured symmetrically to the center plane 135. That is, the angles of the inclinations of the distribution surfaces 142 and 143 of each of the holograms 132 and 133 sequentially and continuously change on both sides symmetrically to the center plane 135, and the grating intervals, or the grating pitches d, sequentially and continuously change to both sides symmetrically to the center plane 135. The two holograms 132 and 133 are disposed so that the points at which the diffraction efficiency of each of the holograms 132 and 133 becomes the maximum may be different from each other in the measurement direction.

When the movable unit 130 moves relatively to the fixed unit 110, namely when the movable unit 130 moves to the photo-receivers 122 and 123 and the light source 112, which are at rest, in FIG. 21, the light diffracted by the first hologram 132 is detected by the first photo-receiver 122, and the light diffracted by the second hologram 133 is detected by the second photo-receiver 123.

Because the points at which the diffraction efficiencies of the two holograms 132 and 133 severally become the maximums are different from each other, the peak position of the light intensity curve of the diffracted light detected by the first photo-receiver 122 and the peak position of the light intensity curve of the diffracted light detected by the second photo-receiver 123 are different from each other. Consequently, there is an intersecting point of the two light intensity curves, namely a point where two light intensities become equal to each other. This point is a fixed point acquired by the fixed point detection apparatus.

SUMMARY OF THE INVENTION

Now, the recent fixed point detection apparatus and the recent displacement measurement apparatus, each using a light emitting diode or a laser, have been improved to have a high resolution, and have become capable of performing a measurement in size of 1 nm or less. On the other hand, in such measurements, the heat generation of a sensor itself is not allowed, and especially means for transmitting a beam through an optical fiber is frequently used with a light source separated from the sensor.

FIG. 22 is a view showing a fixed point detection apparatus 160 transmitting a beam emitted from a light source 161 to a detection unit 164 through a polarization maintaining type optical fiber 163 to detect a fixed point. The fixed point detection apparatus 160 transmits a beam emitted from the light source 161 to a condenser lens 162 through the polarization maintaining type optical fiber 163 to radiate the beam to two diffraction gratings 166 and 167 disposed on a measurement object 169 in a state of adjoining mutually. Then the fixed point detection apparatus 160 receives the light diffracted by an edge 168 of the two diffraction gratings 166 and 167 with two light receiving elements 170 and 171, and compares the amounts of the lights received by the two light receiving elements 170 and 171 with a comparator 172 to determine a point at which the compared signal takes an arbitrary magnitude as the fixed point.

In this manner, the fixed point detection apparatus 160 of FIG. 22 uses the polarization maintaining type optical fiber 163 in order to transmit the beam emitted from the light source 161 in the state of holding the polarization component thereof. However, polarization is sometimes disturbed owing to the influences of the stress or the bending of the fiber, and the disturbance may influence on the detection unit 164 side to make it scarcely possible to perform stable measurements.

The situation may be specifically described as follows. A case where the polarization axis of a beam outgoing from the optical fiber 163 slightly changes owing to a bending and a stress of the optical fiber 163 results in a change of the polarization components of the beams to be entered into the diffraction gratings 166 and 167. Because, in general, the diffraction efficiency of a diffraction grating not only differs according to the polarization component of an entering beam, but also differ according to individuals, the amounts of the lights entering the light receiving elements 170 and 171 change, and an observer will recognize the situation as if the fixed point were shifted.

Accordingly, it is necessary to stabilize the polarization axis of a beam outgoing from the optical fiber 163 as much as possible for performing the detection of the fixed point stably in the fixed point detection apparatus 160.

Next, FIG. 23 is a view showing a displacement measurement apparatus 180 transmitting a beam emitted from a light source 181 to a detection unit 184 through a polarization maintaining type optical fiber 183 to measure a displacement of a measurement object with a detection unit 184. After the beam emitted from the light source 181 has been transmitted to a condenser lens 185 through the polarization maintaining type optical fiber 183, the beam is entered into a polarization beam splitter 186. The polarization beam splitter 186 divides the entered beam into two parts to enter the divided beams into a diffraction grating scale 187. The diffracted lights acquired here pass through $\lambda/4$ wavelength plates 188 and 189, and are reflected by mirror surfaces 191 and 192, respectively, to return to the polarization beam splitter 186 by tracing the same optical paths. The two beams are again combined by the polarization beam splitter 186 to advance toward a polarization element 193 side. The interference signal after passing through the polarization element 193 is converted into an electrical signal by a light receiving element 194. Thus, the movement quantity of the diffraction grating can be measured.

However, also in the displacement measurement apparatus 180, in a case where polarization is disturbed by the influences of a stress or a bending of the optical fiber 183, an optical quantity ratio by which a beam is divided into two parts by the polarization beam splitter 186 changes according to the disturbance. The change of the optical quantity ratio of the two beams appears as a change of a modulation factor when the two beams are again combined by the polarization beam splitter 186 to be an interference signal, and the change of the modulation factor causes output variations of signal outputs. Because the output variations exert harmful influences on the precisions of displacement measurements, it is needed to stabilize the polarization axis of a beam outgoing from an optical transmission unit as much as possible.

Accordingly, there is a need for a displacement detection apparatus, a displacement measurement apparatus and a fixed point detection apparatus, each capable of a high-accuracy fixed point detection and a high-accuracy displacement detection by decreasing the disturbance of polarization owing to the bending and the stress of an optical fiber transmitting a light emitted from a light source to the detection side.

For settling the problem, a displacement detection apparatus according to an embodiment of the present invention includes: a light source, extinction ratio conversion means, a condenser lens, a polarization maintaining type optical fiber, a diffraction grating and light receiving means. The light source emits a light. The extinction ratio conversion means raises an extinction ratio of the light emitted from the light source to 20 dB or more. The condenser lens condenses the light having the extinction ratio made to be 20 dB or more by the extinction ratio conversion means. The polarization maintaining type optical fiber transmits the light condensed by the condenser lens. The diffraction grating is attached to a measurement object and subjected to an irradiation of the light transmitted by the optical fiber to diffract the irradiated light. The light receiving means receives the light diffracted by the diffraction grating. The displacement detection apparatus adjusts a polarization axis of the light to an optical axis of the optical fiber or an axis perpendicular to the optical axis to allow the light to enter into the optical fiber, in which the light has the extinction ratio raised to 20 dB or more by the extinction ratio conversion means and is condensed by the condenser lens. With this configuration, the displacement detection apparatus detects a displacement of the measurement object based on a magnitude of a received light quantity of the diffracted light received by the light receiving means.

According to the displacement detection apparatus, the polarization axis of the light, which has the extinction ratio raised to 20 dB or more by the extinction ratio conversion means and has been condensed by the condenser lens, is adjusted to the optical axis of the optical fiber or the axis perpendicular to the optical axis to be entered into the optical fiber. The disturbance of the polarization caused by the bending and the stress of the optical fiber can be decreased consequently.

For settling the problem, a displacement measurement apparatus according to an embodiment of the present invention includes: a light source, extinction ratio conversion means, a condenser lens, a polarization maintaining type optical fiber, a polarization beam splitter, a diffraction grating, a phase plate, two reflection mirrors, a polarization element and a light receiving element. The light source emits a light. The extinction ratio conversion means changes the light emitted from the light source to a linearly polarized light and raises an extinction ratio of the linearly polarized light to 20 dB or more. The condenser lens condenses the light having the extinction ratio made to be 20 dB or more by the extinction ratio conversion means. The polarization maintaining type optical fiber transmits the light condensed by the condenser lens. The polarization beam splitter divides the light transmitted by the optical fiber into two parts. The diffraction grating is attached to a measurement object, and receives an incidence of the light divided into the two parts by the polarization beam splitter to acquire a diffracted light. The phase plate changes polarizations of the diffracted lights of the lights divided into the two parts by the diffraction grating. Each of the two reflection mirrors reflects one of the two diffracted lights having the polarizations changed by the phase plate to guide the diffracted lights to the diffraction grating again through the phase plate. The polarization element makes the two diffracted lights interfere with each other, the diffracted lights guided to the diffraction grating by the two reflection mirrors, diffracted by the diffraction grating, entering the polarization beam splitter, and reflected and transmitted by the polarization beam splitter. The light receiving element receives an interfered light acquired by the polarization element. In the displacement measurement apparatus, a polarization axis of the light is adjusted to an optical axis of the optical fiber or an axis perpendicular to the optical axis to allow the light to enter into the optical fiber, the light having the extinction ratio raised to 20 dB or more by the extinction ratio conversion means and being condensed by the condenser lens. The displacement measurement apparatus measures a displacement of the measurement object based on a magnitude of a received light quantity of the diffracted light received by the light receiving means.

According to the displacement measurement apparatus, the polarization axis of the light, which has the extinction ratio raised to 20 dB or more by the extinction ratio conversion means and has been condensed by the condenser lens, is adjusted to the optical axis of the optical fiber or the axis perpendicular to the optical axis to be entered into the optical fiber. The disturbance of the polarization caused by the bending and the stress of the optical fiber can be decreased consequently.

For settling the problem, a fixed point detection apparatus according to an embodiment of the present invention includes: a light source, extinction ratio conversion means, a condenser lens, a polarization maintaining type optical fiber, two diffraction gratings, two light receiving means, and comparison means. The light source emits a light. The extinction ratio conversion means changes the light emitted from the light source to a linearly polarized light and raises an extinction ratio of the linearly polarized light to 20 dB or more. The condenser lens condenses the light having the extinction ratio made to be 20 dB or more by the extinction ratio conversion means. The polarization maintaining type optical fiber transmits the light condensed by the condenser lens. The two diffraction gratings are disposed to mutually adjoin, and are subjected to an irradiation of the light transmitted by the optical fiber to diffract the light. Each of the two light receiving means receives the light diffracted by one of the two diffraction gratings. The comparison means compares received light quantities of the two light receiving means. With this configuration, the fixed point detection apparatus adjusts a polarization axis of the light to an optical axis of the optical fiber or an axis perpendicular to the optical axis to enter the light into the optical fiber, the light having the extinction ratio raised to 20 dB or more by the extinction ratio conversion means and being condensed by the condenser lens, and determines a fixed point based on a result of the comparison by the comparison means, of the received light quantities of the two light receiving means.

According to the fixed point detection apparatus, the polarization axis of the light, which has the extinction ratio raised to 20 dB or more by the extinction ratio conversion means and has been condensed by the condenser lens, is adjusted to the optical axis of the optical fiber or the axis perpendicular to the optical axis to be entered into the optical fiber. The disturbance of the polarization caused by the bending and the stress of the optical fiber can be decreased consequently.

For settling the problem, a displacement detection apparatus according to an embodiment of the present invention includes: a light source, extinction ratio conversion means, a condenser lens, a polarization maintaining type optical fiber, a depolarization element, a diffraction grating, and light receiving means. The light source emits a light. The extinction ratio conversion means raises an extinction ratio of the light emitted from the light source to 20 dB or more. The condenser lens condenses the light having the extinction ratio made to be 20 dB or more by the extinction ratio conversion means. The polarization maintaining type optical fiber transmits the light condensed by the condenser lens. The depolarization element depolarizes the light transmitted by the optical fiber. The diffraction grating is attached to a measurement object and subjected to an irradiation of the light depolarized by the depolarization element. The light receiving means receives the light diffracted by the diffraction grating. With this configuration, the displacement detection apparatus adjusts a polarization axis of the light to an optical axis of the optical fiber or an axis perpendicular to the optical axis to enter the light into the optical fiber, the light having the extinction ratio raised to 20 dB or more by the extinction ratio conversion means and being condensed by the condenser lens. The displacement detection apparatus detects a displacement of the measurement object based on a magnitude of a received light quantity of the diffracted light received by the light receiving means.

According to the displacement detection apparatus, the polarization axis of the light, which has the extinction ratio raised to 20 dB or more by the extinction ratio conversion means and has been condensed by the condenser lens, is adjusted to the optical axis of the optical fiber or the axis perpendicular to the optical axis to be entered into the optical fiber. Moreover, the polarization of the light transmitted by the optical fiber is depolarized by the depolarization element. The disturbance of the polarization caused by the bending and the stress of the optical fiber can be decreased consequently.

For settling the problem, a displacement measurement apparatus according to an embodiment of the present invention includes: a light source, extinction ratio conversion means, a condenser lens, a polarization maintaining type optical fiber, a depolarization element, a polarization beam splitter, a diffraction grating, a phase plate, two reflection mirrors, a polarization element, and a light receiving element. The light source emits a light. The extinction ratio conversion means changes the light emitted from the light source to a linearly polarized light and raises an extinction ratio of the linearly polarized light to 20 dB or more. The condenser lens condenses the light having the extinction ratio made to be 20 dB or more by the extinction ratio conversion means. The polarization maintaining type optical fiber transmits the light condensed by the condenser lens. The depolarization element depolarizes the light transmitted by the optical fiber. The polarization beam splitter divides the light depolarized by the depolarization element into two parts. The diffraction grating is attached to a measurement object, and receives an incidence of the light divided into the two parts by the polarization beam splitter to acquire a diffracted light. The phase plate changes polarizations of the diffracted lights of the lights divided into the two parts by the diffraction grating. Each of the two reflection mirrors reflects one of the two diffracted lights having the polarizations changed by the phase plate to guide the diffracted lights to the diffraction grating again through the phase plates. The polarization element makes the two diffracted lights interfere with each other, the diffracted lights guided to the diffraction grating by the two reflection mirrors, diffracted by the diffraction grating, entering the polarization beam splitter, and reflected and transmitted by the polarization beam splitter. The light receiving element receives an interfered light acquired by the polarization element. With this configuration, the displacement measurement apparatus adjusts a polarization axis of the light to an optical axis of the optical fiber or an axis perpendicular to the optical axis to enter the light into the optical fiber, the light having the extinction ratio raised to 20 dB or more by the extinction ratio conversion means and being condensed by the condenser lens. The displacement measurement apparatus measures a displacement of the measurement object based on a magnitude of a received light quantity of the diffracted light received by the light receiving means.

According to the displacement measurement apparatus, the polarization axis of the light, which has the extinction ratio raised to 20 dB or more by the extinction ratio conversion means and has been condensed by the condenser lens, is adjusted to the optical axis of the optical fiber or the axis perpendicular to the optical axis to be entered into the optical fiber. Moreover, the polarization of the light transmitted by the optical fiber is depolarized by the depolarization element. The disturbance of the polarization caused by the bending and the stress of the optical fiber can be decreased consequently.

For settling the problem, a fixed point detection apparatus according to an embodiment of the present invention includes: a light source, extinction ratio conversion means, a condenser lens, a polarization maintaining type optical fiber, a depolarization element, two diffraction gratings, two light receiving means, and comparison means. The light source emits a light. The extinction ratio conversion means changes the light emitted from the light source to a linearly polarized light and raises an extinction ratio of the linearly polarized light to 20 dB or more. The condenser lens condenses the light having the extinction ratio made to be 20 dB or more by the extinction ratio conversion means. The polarization maintaining type optical fiber transmits the light condensed by the condenser lens. The depolarization element depolarizes the light transmitted by the optical fiber. The two diffraction gratings are disposed to mutually adjoin and subjected to an irradiation of the light depolarized by the depolarization element to diffract the light. Each of the two light receiving means receives the lights diffracted by the two diffraction gratings. The comparison means compares received light quantities of the two light receiving means. With this configuration, the fixed point detection apparatus adjusts a polarization axis of the light to an optical axis of the optical fiber or an axis perpendicular to the optical axis to enter the light into the optical fiber, the light having the extinction ratio raised to 20 dB or more by the extinction ratio conversion means and being condensed by the condenser lens. The fixed point detection means determines a fixed point based on a result of the comparison by the comparison means, of the received light quantities of the two light receiving means.

According to the fixed point detection apparatus, the polarization axis of the light, which has the extinction ratio raised to 20 dB or more by the extinction ratio conversion means and has been condensed by the condenser lens, is adjusted to the optical axis of the optical fiber or the axis perpendicular to the optical axis to be entered into the optical fiber. Moreover, the polarization of the light transmitted by the optical fiber is depolarized by the depolarization element. The disturbance of the polarization caused by the bending and the stress of the optical fiber can be decreased consequently.

The displacement detection apparatus, the displacement measurement apparatus, the fixed point detection apparatus according to the present invention make it possible to perform a high-accuracy displacement detection, a high-accuracy displacement measurement and a high-accuracy fixed point detection, respectively, in addition to the advantages described above.

DETAILED DESCRIPTION OF PREFERRED EMBODIMENTS

In the following, embodiments of a displacement measurement apparatus and a fixed point detection apparatus for implementing the present invention are described with reference to the attached drawings.

Figure 1:
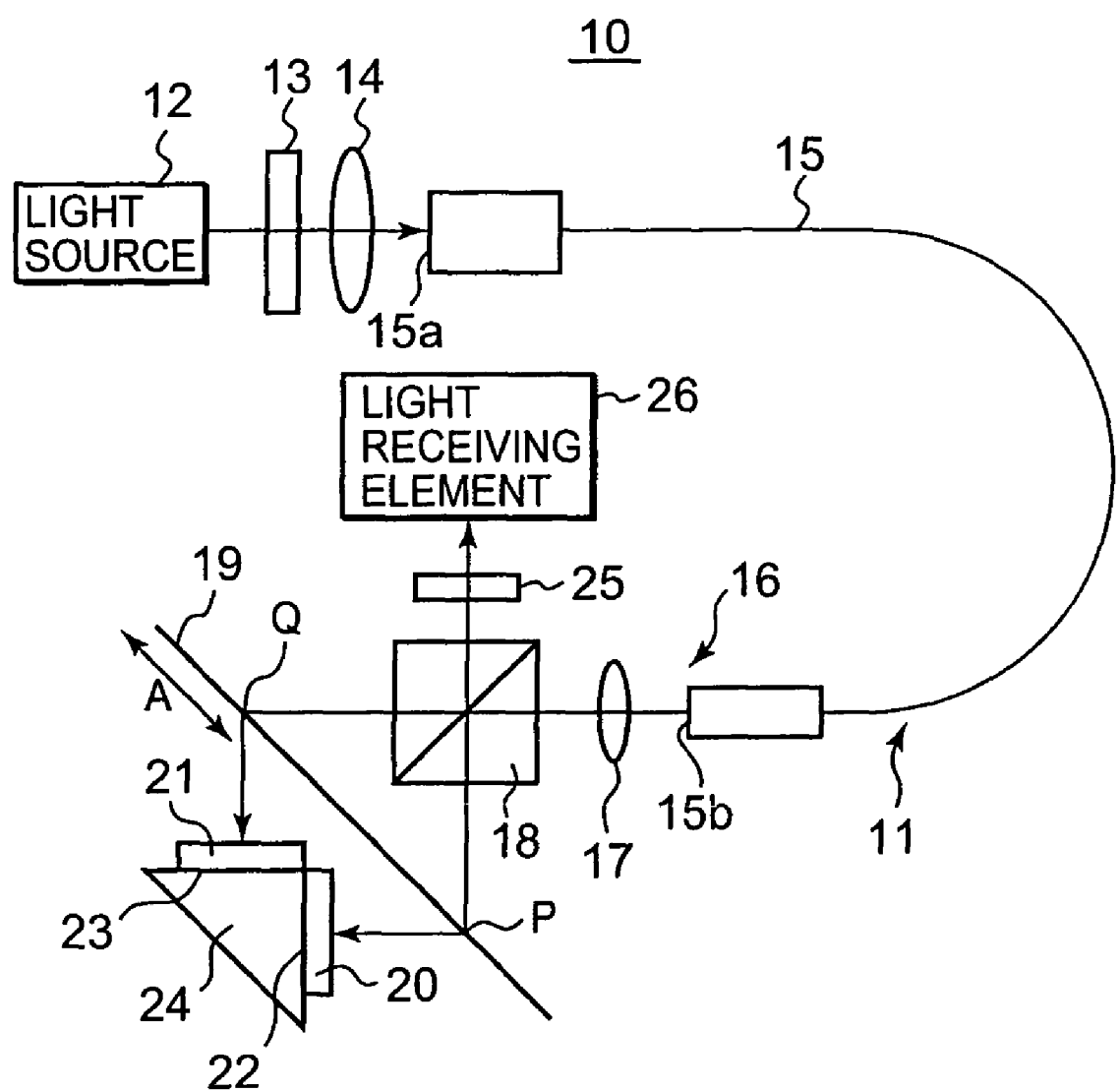
FIG. 1 is a configuration diagram showing a displacement measurement apparatus of an embodiment of the present invention.

FIG. 1 is a diagram showing a configuration of a displacement measurement apparatus 10. The displacement measurement apparatus 10 is used in the fields of semiconductor device manufacturing, liquid crystal device manufacturing and the like, for measuring a movement quantity in an order of nano meter (nm), for example. Consequently, there is a possibility that the displacement measurement apparatus 10 can hardly perform stable measurements because the sensor thereof is affected by the heat generated in the light source unit thereof. For this reason, it is necessary to prevent the transfer of the generated heat to a detection unit 16. Accordingly, the displacement measurement apparatus 10 is configured to especially separate a light source 12 from the detection unit 16, and to transmit a beam emitted from the light source 12 to the detection unit 16 through an optical fiber 15.

For this reason, the displacement measurement apparatus 10 is equipped with the light source 12 emitting a beam, a polarizing plate 13, a condenser lens 14 and the polarization maintaining type optical fiber 15. The polarizing plate 13 is a kind of a polarization element used as extinction ratio conversion means which converts the beam from the light source 12 into a linearly polarized light having a high extinction ratio of 20 dB or more. The condenser lens 14 condenses the linearly polarized light having the high extinction ratio from the polarizing plate 13. The polarization maintaining type optical fiber 15 transmits the linearly polarized light condensed by the condenser lens 14.

Moreover, the displacement measurement apparatus 10 is composed of a condenser lens 17, a polarization beam splitter 18, a diffraction grating 19, two phase plates 20 and 21, a reflecting prism 24, a polarization element 25 and a light receiving element 26. The condenser lens 17 condenses the beam of the linearly polarized light transmitted from the optical fiber 15. The polarization beam splitter 18 divides the linearly polarized beam condensed by the condenser lens 17 into two parts. The two beams divided by the polarization beam splitter 18 enter the diffraction grating 19, which is attached to a measurement object. The two phase plates 20 and 21 severally change the polarization directions of the two diffracted light acquired by the diffraction grating 19. The two phase plates 20 and 21 are disposed so that they may mutually form an angle of 90 degrees. The reflecting prism 24 includes two mirror surfaces 22 and 23, on which the two phase plates 20 and 21 are attached, respectively. The two mirror surfaces 22 and 23 are formed so that they may mutually form an angle of 90 degrees. The two mirror surfaces 22 and 23 make the diffracted lights from the diffraction grating 19 go and return on the two phase plates 20 and 21, respectively. The polarization beam splitter 18 re-combines the diffracted lights from the diffraction grating 19, and enters two beams into the polarization element 25, which makes the entered beams interfere with each other. The light receiving element 26 converts the quantity of the received interfered light of the two beams into an electric signal.

Here, the light source 12, the polarization element 13, the condenser lens 14 and the polarization maintaining type optical fiber 15 can be called as an optical transmission unit 11 because they transmit the beam emitted by the light source 12 to the detection unit 16 side. In addition, the detection unit 16 is composed of the condenser lens 17, the polarization beam splitter 18, the diffraction grating 19, the two phase plates 20 and 21, the two mirrors 22 and 23, the polarization element 25 and the light receiving element 26.

In the following, the details of each unit constituting the displacement measurement apparatus 10 are described. First, the light source 12 may be one emitting a coherent beam or a light emitting diode emitting a light having a low coherence. Moreover, the light emitted from the light source 12 may be one having a polarization property or an unpolarized one.

Figure 2:
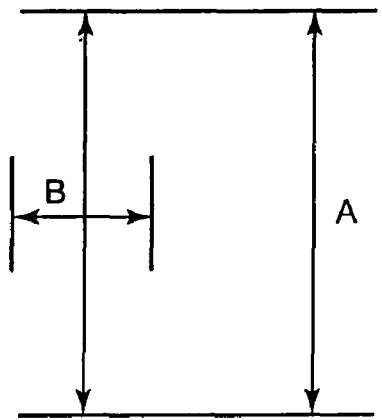
FIG. 2 is a diagram used for illustrating an extinction ratio.

The polarizing plate 13, which is a kind of the polarization element used as the extinction ratio conversion means, converts a beam from the light source 12 to a linearly polarized light having a high extinction ratio of 20 dB or more. The extinction ratio of 20 dB or more means that a rate A:B is a rate 100:1 or more, where A denotes a linearly polarized light, which is the major axis, and B denotes a small leakage light, which is the minor axis, as shown in FIG. 2. The higher the extinction ratio is, the better the linearly polarized light is. The polarization element 13 may be configured to have an extinction ratio of about 30 dB, namely the A:B is about 1000:1. As the polarization element 13, a glass containing silver halide which is made to have a function of a polarizing filter by being pulled in a fixed direction so that the shapes of the inner particles are oriented into a predetermined direction may be used. In addition, as the extinction ratio conversion means, a polarization beam splitter which converts a beam from the light source 12 into a linearly polarized light having a high extinction ratio of 20 dB or more may be used.

Figure 3:
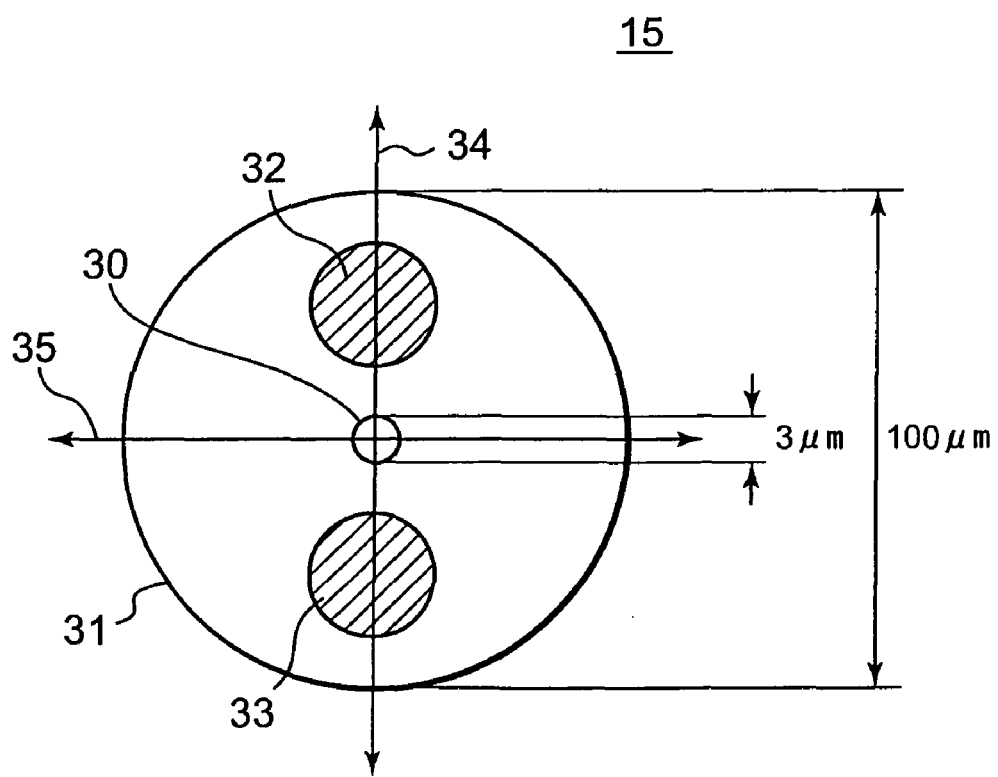
FIG. 3 is a sectional view of a polarization maintaining type optical fiber.

The polarization maintaining type optical fiber 15 takes a sectional shape of concentric circles in which, for example, a clad 31 having a diameter of 100 µm envelops a circular core 30 having a diameter of 3 µm, as shown in FIG. 3. Both the core 30 and the clad 31 are made of, for example, the silica glasses having refractive indices different from each other. The refractive index of the core 30 is higher than that of the clad 31. If a light having a wavelength λ, for example, in a range of from 600 nm to 700 nm is sent into the core 30, the light is transmitted, being reflected by the boundary between the core 30 and the clad 31 having the low refractive index. Two glasses 32 and 33, each having a circular cross section different from those of the core 30 and the clad 31, are provided on both the sides of the core 30 as if they have the core 30 in between. The two glasses 32 and 33 have the same coefficient of thermal expansion, and they function to contract the whole clad 31. They also perform the functions of cooling the whole clad 31, and of keeping the stress applied onto the core 30 to be constant. The axis connecting the centers of the two glasses 32 and 33 with the centers of the core 30 and clad 31 is an optical axis 34. The polarizing axis of a beam emitted from the light source 12 is adjusted to the optical axis 34 of the polarization maintaining type optical fiber 15 through the polarizing plate 13 and the condenser lens 14 to enter the beam into the optical fiber 15. Moreover, an ellipse core type polarization maintaining type optical fiber having a core the cross section of which is in the shape of an ellipse may be used.

The polarization beam splitter 18 divides a beam which has been transmitted by the polarization maintaining type optical fiber 15 and condensed by the condenser lens 17 into two lights, one having an S polarization component and the other having a P polarization component. The polarization axis of the incident light is adjusted to an angle at which the power of the S polarization component of an outgoing light from the polarization beam splitter 18 is almost equal to the power of the P polarization component of the outgoing light. The S polarization component is a polarization component which oscillates perpendicular to an incident plane composed of a light entering a boundary surface of lights and a light reflected by the boundary surface. Moreover, the P polarization component is a polarization component which oscillates horizontal to the incident plane. The light having the S polarization component is reflected by the polarization beam splitter 18, and the light having the P polarization component is transmitted through the polarization beam splitter 18.

The diffraction grating 19 may be a volume type hologram. This diffraction grating 19 is attached to the object used as the measurement object. The diffraction grating 19 is movable in the direction of an arrow A in FIG. 1. The pitch of the diffraction grating 19 is set to, for example, 0.55 μm. The incident position (point Q) of the P polarization component which has been transmitted through the polarization beam splitter 18 into the diffraction grating 19 differs from the incident position (point P) of the S polarization component which has been reflected by the polarization beam splitter 18.

The optical axis of the first quarter wavelength plate 20 attached to the first mirror surface 22 of the reflecting prism 24 is set to be inclined by 45 degrees to the polarization direction of an entering light. Similarly, the optical axis of the second quarter wavelength plate 21 attached to the second mirror surface 23 of the reflecting prism 24 is also inclined by 45 degrees to the polarization direction of an entering light.

The polarization element 25 provided on the light receiving element 26 side is inclined by 45 degrees to the polarization direction of an entering light. Consequently, two lights from the polarization beam splitter 18 become an interfered wave by passing through the polarization element 25. The light receiving element 26 converts the light quantity of the interfered wave into an electric signal.

Next, the operation of the displacement measurement apparatus 10 composed of each unit described above is described. When a coherent or low coherent light emitted from the light source 12 enters the polarizing plate 13, the light is changed into a linearly polarized light having a high extinction ratio of, for example, 30 dB. The linearly polarized light having the high extinction ratio is condensed by the condenser lens 14, and the polarization axis of the linearly polarized beam is adjusted to the optical axis 34 of the polarization maintaining type optical fiber 15, as described above with reference to FIG. 3, and the adjusted beam is entered into the polarization maintaining type optical fiber 15. Thus, if the polarization axis of the beam changed to the linearly polarized light by the polarizing plate 13 is adjusted to the optical axis 34 of the polarization maintaining type optical fiber 15 when the beam is entered into the optical fiber 15, then the changes of the extinction ratio caused by the bending and the stress of the optical fiber 15 can be lessened. Moreover, the beam may be entered with the polarization axis thereof adjusted to an axis 35 perpendicular to the optical axis 34.

In order to adjust the polarization axis of the beam to the optical axis of the polarization maintaining type optical fiber 15, there is a method of performing the adjustment in order that the extinction ratio of the beam emitted from an exit end 15b of the optical fiber 15 may take the maximum value.

The optical transmission unit 11 composed of the light source 12, the polarizing plate 13, the condenser lens 14 and the polarization maintaining type optical fiber 15 can not only raise the extinction ratio of the beam emitted from the exit end 15b of the optical fiber 15, but also decrease the changes of the extinction ratio caused by the bending and the stress of the optical fiber in this manner.

The beam emitted from the polarization maintaining type optical fiber 15 constituting the optical transmission unit 11 is condensed by the condenser lens 17 on the detection unit 16 side before the beam enters the polarization beam splitter 18. The polarization beam splitter 18 divides the entered light into two lights, one having the S polarization component and the other having the P polarization component, as mentioned above. The light having the S polarization component is reflected by the polarization beam splitter 18, and enters the point P of the diffraction grating 19. The light having the P polarization component is transmitted by the polarization beam splitter 18, and enters the point Q of the diffraction grating 19.

Each of the lights having entered the points P and Q of the diffraction grating 19 is diffracted in the direction expressed by the following formula.

$$\sin\theta_1 + \sin\theta_2 = n\cdot\lambda/\Lambda$$

where $\theta_1$ denotes an incident angle onto the diffraction grating 19; $\theta_2$ denotes the angle of diffraction from the diffraction grating 19; $\Lambda$ denotes the pitch (width) of the grating; $\lambda$ denotes the wavelength of the light; and n denotes a diffraction order.

The light having diffracted at the point P of the diffraction grating 19, that is, the light having the S polarization component passes through the first quarter wavelength plate 20 attached onto the first mirror surface 22 of the reflecting prism 24, and is perpendicularly reflected by the first mirror surface 22. Then, the reflected light again returns to the point P to be diffracted by the diffraction grating 19. Because the optical axis of the first quarter wavelength plate 20 is inclined to the polarization direction of the entered light by 45 degrees at this time, the light having returned to the point P has been changed to the light of the P polarization component. That is, after the S polarization component having been diffracted at the point P of the diffraction grating 19 has passed through the first quarter wavelength plate 20, the S polarization component is reflected by the first mirror surface 22 of the reflecting prism 24 and passes through the first quarter wavelength plate 20. Consequently, the returning polarization axis takes a right angle to the angle of the going polarization axis.

Moreover, the light having diffracted at the point Q, i.e., the light having the P polarization component, similarly passes through the second quarter wavelength plate 21 attached onto the second mirror surface 23 of the reflecting prism 24, and is perpendicularly reflected by the reflecting prism 24. Then, the reflected light again returns to the point Q to be diffracted by the diffraction grating 19. Because the optical axis of the second quarter wavelength plate 21 is inclined to the polarization direction of the entered light by 45 degrees at this time, the light having returned to the point Q has been changed to the light of the S polarization component. That is, after the P polarization component having been diffracted at the point Q of the diffraction grating 19 has passed through the second quarter wavelength plate 21, the P polarization component is reflected by the second mirror surface 23 of the reflecting prism 24 and passes through the second quarter wavelength plate 21. Consequently, the returning polarization axis takes a right angle to the angle of the going polarization axis.

The lights diffracted again at the points P and Q in this manner return to the polarization beam splitter 18. Because the light which has returned from the point P has the P polarization component, the light passes through the polarization beam splitter 18. Moreover, because the light which has returned from the point Q has the S polarization component, the light is reflected by the polarization beam splitter 18. Consequently, the lights which have returned from the points P and Q are superposed by the polarization beam splitter 18, and then enter the polarization element 25.

The polarization element 25 makes the two beams superposed by the polarization beam splitter 18 interfere with each other. The light receiving element 26 converts the light quantity of the light generated by the interference by the polarization element 25 into an electric signal to acquire an interference signal. The displacement measurement apparatus 10 measures a movement quantity of the diffraction grating 19 moving to the arrow A direction in an order of, for example, a nano meter (nm) or less.

The interference signal can be expressed by $A\cos(4Kx+\delta)$, where K denotes $2\pi/\Lambda$; x denotes a movement quantity; and $\delta$ denotes an initial phase. For example, when the pitch Λ of the diffraction grating 19 is set to 0.55 μm, the measurement of one period of the interfered wave equivalent to the movement quantity of 0.1375 μm of the diffraction grating 19 is enabled, and a very fine resolution of about 0.6895 nm can be acquired by converting the interfered wave into an electric signal and by interpolating data acquired by a division of the period into 200 pieces using A/D conversion or the like, for example. It is needless to say that a measurement of a fine displacement of a resolution of 10 nm or less especially needs stable signal outputting. By realizing very small changes of the extinction ratio of a beam emitted from the optical transmission unit 11, the modulation factor of an interfered wave acquired by the passing through the polarization element 25 can be stabilized, and a highly stabilized displacement detection with a high resolution is enabled.

Figure 4:
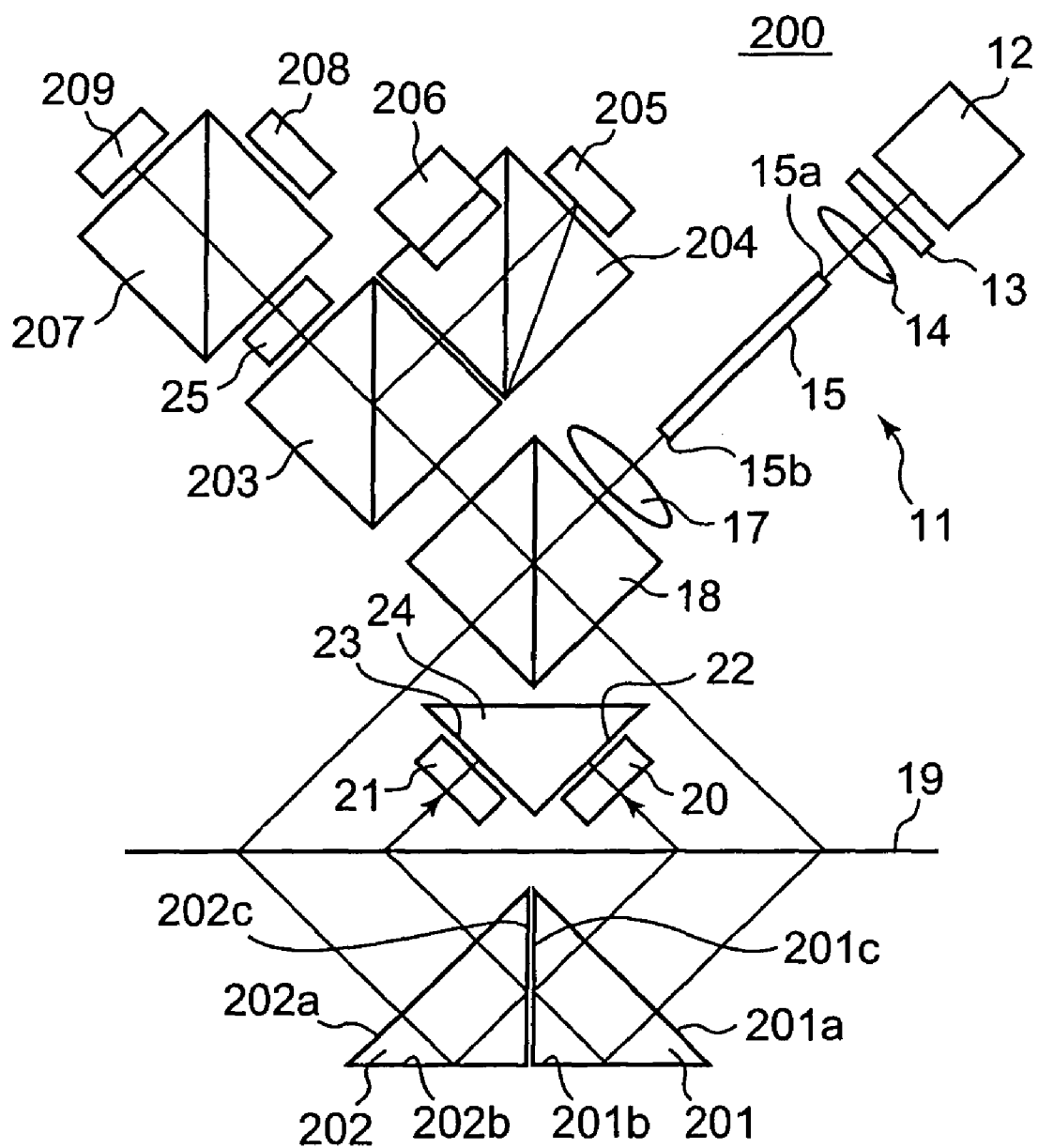
FIG. 4 is a view showing an application example of the displacement measurement apparatus.

Moreover, by increasing the number of times of the diffractions, even if the diffraction optical system is applied to a detection optical system in which the interference signal is set to Acos(8Kx+δ), similar effects can be acquired. FIG. 4 is a view showing a displacement measurement apparatus 200, being an application example, configured to increase the number of times of diffractions. The configuration differs from that of FIG. 1 as follows. That is, two diffracted lights having been divided into two parts by the polarization beam splitter 18 and having been diffracted by the diffraction grating 19 enter reflecting prisms 201 and 202 from incidence planes 201a and 202a, respectively, and reflected on reflection surfaces 201b and 202b, and reflection surfaces 201c and 202c, respectively. Then the reflected lights enter the diffraction grating 19 again, and are diffracted by the diffraction grating 19. After that, the re-diffracted lights reach the two phase plates 20 and 21 and the reflecting prism 24. The lights reflected by the reflecting prism 24 pass through the two phase plates 20 and 21 again, then are transmitted through the diffraction grating 19 to be diffracted. The diffracted lights are again reflected by the reflecting prisms 201 and 202, and then are further diffracted by the diffraction grating 19 to reach the polarization beam splitter 18.

The polarization beam splitter 18 superposes the entered polarization components on each other, and sends the superposed components to a beam splitter 203. The beam splitter 203 divides the entered light into two parts. The beam splitter 203 enters one light into a polarization beam splitter 204, and sends the other light to the polarization element 25. The polarization element 25 polarizes the light transmitted through the beam splitter 203 to enter the polarized light into a polarization beam splitter. 207.

The light entering the polarization beam splitter 204 is divided into a light having the S polarization component and a light having the P polarization component. The light having the S polarization component is entered into a photoelectric transducer 205, and the light having the P polarization component is entered into a photoelectric transducer 206. The light entered into the polarization beam splitter 207 is divided into a light having the S polarization component and the light having the P polarization component. The light having the S polarization component is entered into a photoelectric transducer 208, and the light having the P polarization component is entered into a photoelectric transducer 209.

Consequently, the photoelectric transducers 205, 206, 208 and 209 can acquire interference signals of Acos(8Kx +δ).

Figure 5:
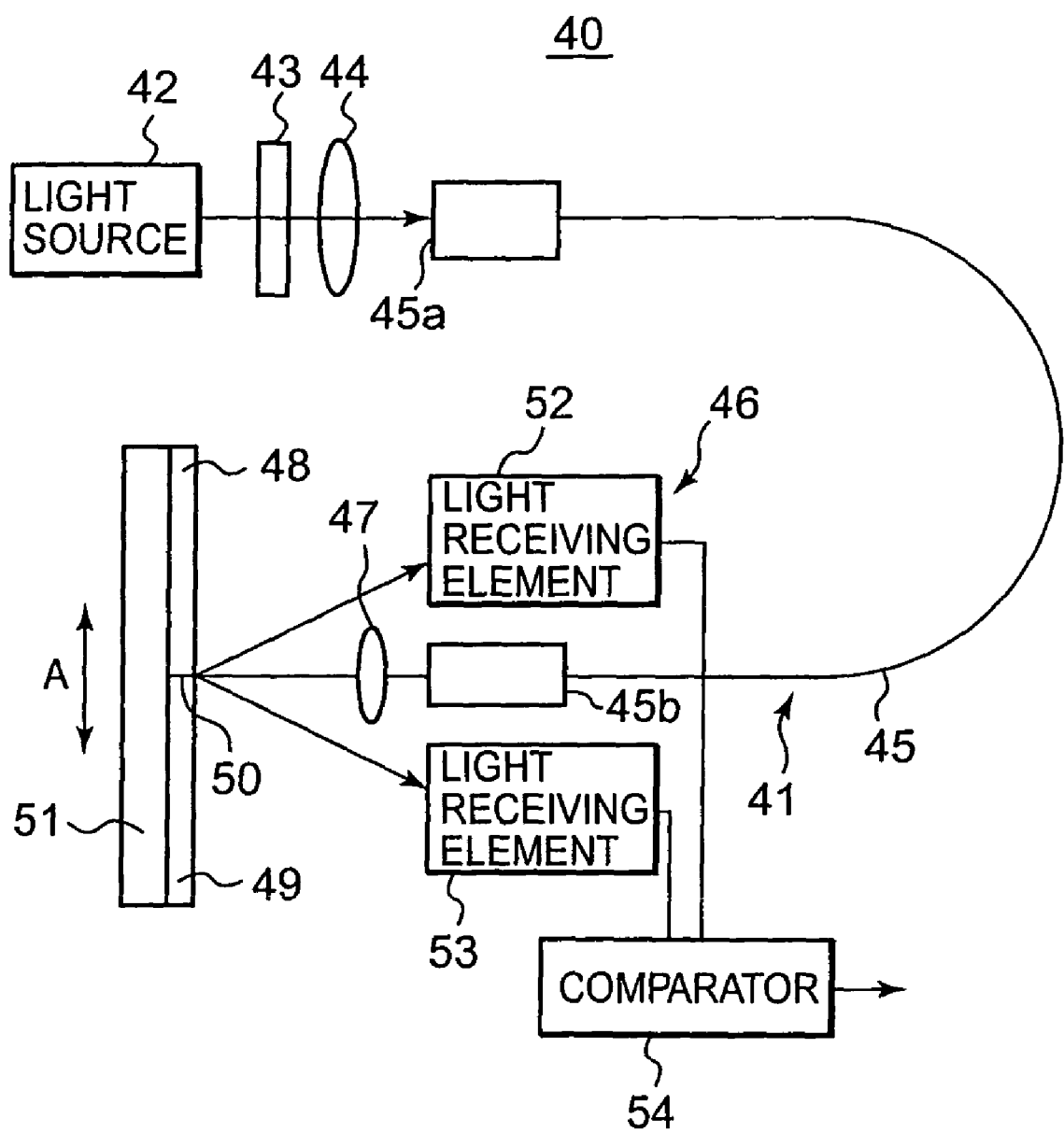
FIG. 5 is a configuration diagram of a fixed point detection apparatus.

FIG. 5 is a view showing the configuration of a fixed point detection apparatus 40. The fixed point detection apparatus 40 is used in the fields of semiconductor device manufacturing, liquid crystal device manufacturing and the like, in each of which a movement quantity of the order of nano meter (nm) is measured. Consequently, also in the fixed point detection apparatus 40, the heat generation of a sensor itself is not allowed. The fixed point detection apparatus 40 is configured to have a light source 42 separated from a detection unit especially, and to transmit a beam emitted from the light source 42 to the detection unit 46 through an optical fiber 45.

The fixed point detection apparatus 40 is used together with the displacement measurement apparatus 10, and detects an absolute position on the diffraction grating 19 of the displacement measurement apparatus 10, for example. The displacement measurement apparatus 10 uses the diffraction grating 19 having a very small pitch Λ of such as 0.55 μm, as described above. If a power source has broken or processing is stopped owing to some accidents when a displacement is measured on the diffraction grating 19, the position of the diffraction grating where the preceding measurement stopped becomes unclear after recovery. Accordingly, the apparatus having been developed for frequently detecting an absolute position on the diffraction grating is the fixed point detection apparatus 40. The fixed point detection apparatus 40 is configured to detect a fixed point by detecting an edge 50 by the use of, for example, two hologram materials having different pitches from each other as two diffraction gratings 48 and 49.

As shown in FIG. 5, the fixed point detection apparatus 40 is composed of the light source 42 emitting a beam, a polarizing plate 43, a condenser lens 44, and the polarization maintaining type optical fiber 45. The polarizing plate 43 is a kind of polarization element used as extinction ratio conversion means and converts the beam from the light source 42 into a linearly polarized light having a high extinction ratio of 20 dB or more. The condenser lens 44 condenses the linearly polarized light having the high extinction ratio from the polarizing plate 43. The polarization maintaining type optical fiber 45 transmits the linearly polarized light condensed by the condenser lens 44.

Moreover, the fixed point detection apparatus 40 includes a condenser lens 47, the two diffraction gratings 48 and 49, two light receiving elements 52 and 53 receiving the lights diffracted by the two diffraction gratings 48 and 49, and a comparator 54. The condenser lens 47 condenses the beam of the linearly polarized light transmitted from the optical fiber 45. The two diffraction gratings 48 and 49 are disposed so as to mutually adjoin, near a boundary portion (edge) 50 of which the linearly polarized beam condensed by the condenser lens 47 focuses. The two light receiving elements 52 and 53 receives the lights diffracted by the two diffraction gratings 48 and 49. The comparator 54 compares the light quantities received by the two light receiving elements 52 and 53 to fix a fixed point based on the compared signal.

In the following, the details of each unit constituting the fixed point detection apparatus are described. First, the light source 42 emits a coherent beam or an incoherent. Moreover, a light source emitting a beam having a polarization or an unpolarized beam may be adopted.

The polarizing plate 43, which is a kind of the polarization element used as the extinction ratio conversion means, converts a beam from the light source 42 to a linearly polarized light having a high extinction ratio of 20 dB or more similarly to the polarizing plate 13 described above. The polarization element 43 can be configured to have an extinction ratio of about 30 dB. In addition, as the extinction ratio conversion means, a polarization beam splitter which converts a beam from the light source 42 into a linearly polarized light having a high extinction ratio of 20 dB or more may be used.

Moreover, the polarization maintaining type optical fiber 45 is the one which has been already described with reference to FIG. 3. Although the description thereof is omitted here, it is important to adjust the polarizing axis of a beam emitted from the light source 42 to the optical axis 34 of the polarization maintaining type optical fiber 45 or the axis 35 to enter the beam into the optical fiber 45.

The reason is that the changes of the extinction ratio caused by the bending and the stress of the polarization maintaining type optical fiber 45 can be lessened by adjusting the polarization axis of the beam to the optical axis 34 of the optical fiber 45 at the time of entering the beam changed to the linearly polarized light by the polarizing plate 43 into the optical fiber 45.

The two diffraction gratings 48 and 49 are disposed to mutually adjoin in order that the linearly polarized beam condensed by the condenser lens 47 may focus in the neighborhood of the edge 50. The two diffraction gratings 48 and 49 may be ones having grating vectors different from each other, or may be ones having grating pitches different from each other. Moreover, a reflection type hologram and a blazed diffraction grating may be also used as the two diffraction gratings 48 and 49. In the configuration shown in FIG. 4, the two diffraction gratings 48 and 49 are reflection type ones, and the +1 order diffraction light of each of the diffraction gratings 48 and 49 is emitted to the same side as that of the incident light. Moreover, a transmission grating may be adopted.

The two light receiving elements 52 and 53 convert the intensities of the diffracted lights acquired from the two diffraction gratings 48 and 49 into electric signals. The two light receiving elements 52 and 53 are disposed on the same end side as the exit end side 45b of the optical fiber 45 to the two diffraction gratings 48 and 49.

The comparator 54 compares the electric signals from the two light receiving elements 52 and 53. The comparison result by the comparator 54 is supplied to a not shown control unit. The control unit determines the point where the two signals become arbitrary magnitudes as a fixed point based on the comparison result of the comparator 54. Moreover, a point where the two signals become the same output may be determined as the fixed point.

Next, the operation of the fixed point detection apparatus 40 configured by each of the units as described above is explained. If a coherent light or an incoherent light emitted from the light source 42 is entered into the polarizing plate 43, the light is changed to a linearly polarized light having a high extinction ratio of, for example, 30 dB. The linearly polarized light having the high extinction ratio is condensed by the condenser lens 44, and the polarization axis of the linearly polarized beam is adjusted to the optical axis 34 of the polarization maintaining type optical fiber 45 to be entered into the polarization maintaining type optical fiber 45, as described with reference to FIG. 3. If the polarization axis of the beam changed to the linearly polarized light by the polarizing plate 43 is adjusted to the optical axis 34 of the polarization maintaining type optical fiber 45 in a case of entering the beam into the optical fiber 45 in this manner, the changes of the extinction ratio owing to the bending and the stress of the optical fiber 45 can be decreased. Moreover, the polarization axis of the beam may be adjusted to the axis 35 perpendicular to the optical axis 34 at the time of entering the beam into the optical fiber 45.

In order to adjust the polarization axis of the beam to the optical axis of the polarization maintaining type optical fiber 45, there is a method of adjusting the polarizing axis so that the extinction ratio of the beam emitted from the exit end 45b of the optical fiber 45 may become the maximum.

An optical transmission unit 41 composed of the light source 42, the polarizing plate 43, the condenser lens 44 and the polarization maintaining type optical fiber 45 can not only raise the extinction ratio of a beam emitted from the exit end 45b of the optical fiber 45, but also decrease the changes of the extinction ratio caused by the bending and the stress of the optical fiber 45 in this manner.

A beam emitted from the polarization maintaining type optical fiber 45 constituting the optical transmission unit 41 is condensed by the condenser lens 47 on the detection unit 46 side before the beam focuses in the neighborhood of the edge 50 of the two diffraction gratings 48 and 49 movable in the arrow A directions in FIG. 5.

The intensities of the diffracted lights acquired from these two diffraction gratings 48 and 49 are converted into electric signals by each of the light receiving elements 52 and 53, respectively. And a point where the two signals take arbitrary magnitudes is determined as the fixed point by the comparator 54 which compares the two signals. As mentioned above, a point where the two signals take the same outputs may be determined as the fixed point. However, the comparison output of the comparator 54 becomes 0 if the two signals agree with each other. In a case where the diffracted lights become extinct and the output of the light receiving elements 52 and 53 are 0, the comparison result also becomes 0. Accordingly, it is preferable to provide an offset in view of preventing false recognition. Therefore, it is desirable to set the arbitrary magnitudes to numeral values having certain degrees of magnitudes to discriminate the arbitrary magnitudes from 0.

Figure 6:
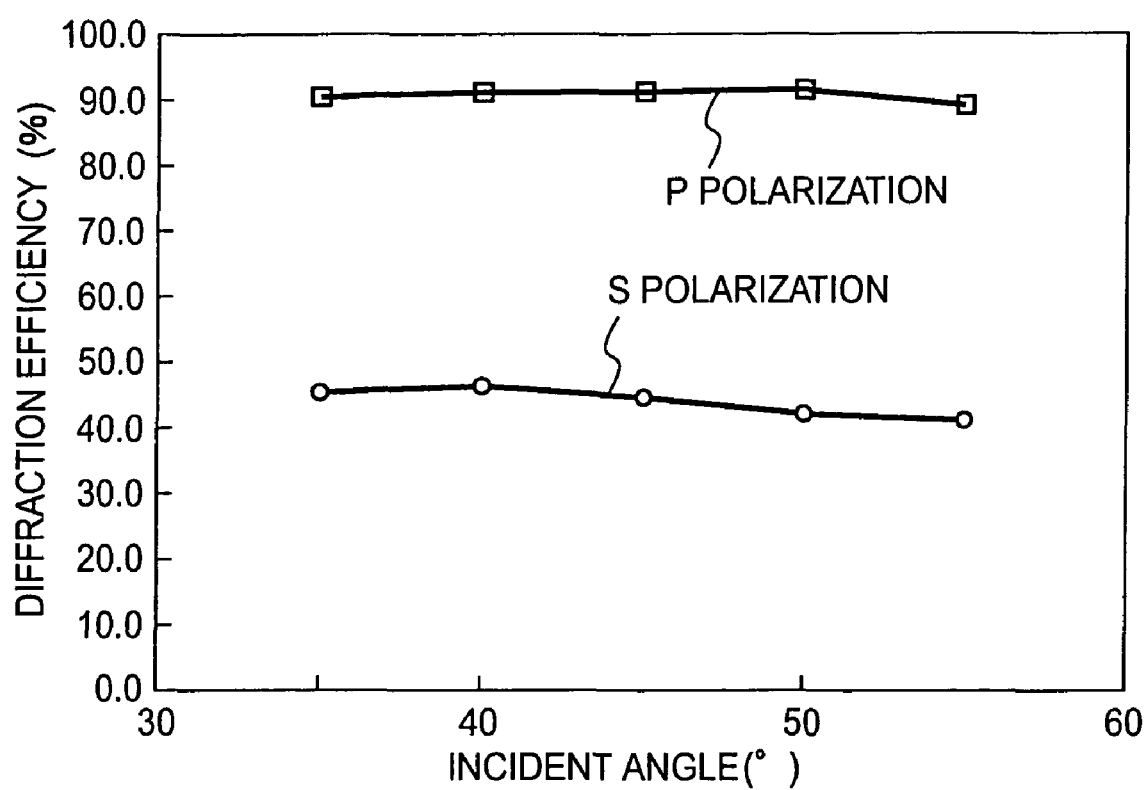
FIG. 6 is a characteristic diagram showing that the diffraction efficiency of an S polarization component and the diffraction efficiency of a P polarization component are significantly different from each other.

The fixed point detection apparatus 40 of the present embodiment thus detects the absolute positions of the diffraction gratings 48 and 49 attached to a measurement object 51. Generally the diffracted light quantity of a diffraction grating differs according to an entering polarization component. That is, the diffraction efficiency of the S polarization component and the diffraction efficiency of the P polarization component are different from each other. For example, when the wavelength of a beam emitted from a light source is 780 nm and the diffraction efficiency of a reflection type hologram is measured using a grating having a pitch of 0.55 µm, as shown in FIG. 6, it can be ascertained that the diffraction efficiency of the S polarization component and the diffraction efficiency of the P polarization component significantly differ from each other. In FIG. 6, the diffraction efficiency of the S polarization component is within a range of from 46% to 41% to an incident angle within a range of from 35 to 55 degrees. On the other hand, the diffraction efficiency of the P polarization component is within a range of from 91% to 92%, and it can be ascertained that the diffraction efficiency of the P polarization component is higher. Moreover, these facts tell that an individual difference occurs in a manufacturing process and the gratings have a certain degree of dispersion generally.

Accordingly, by lessening the changes of the extinction ratios of a beam entering the diffraction gratings, the fixed point detection can be performed in a state of being stabilized without being affected by these changes.

Figure 7:
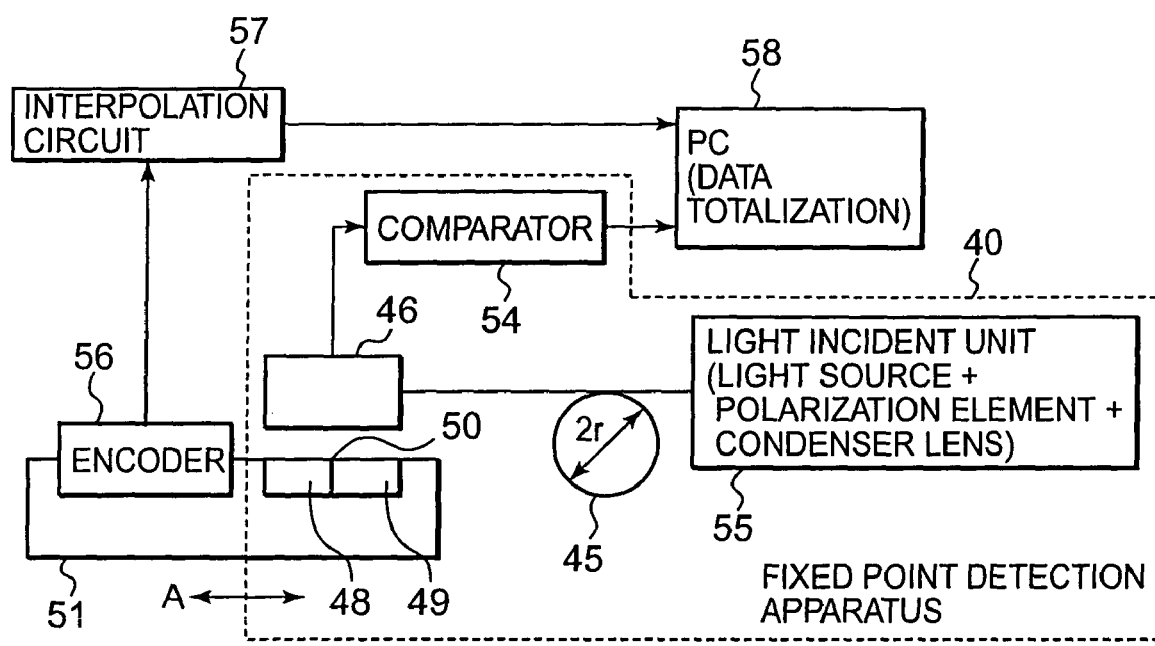
FIG. 7 is a configuration diagram of a system for measuring how a fixed point detection position changes with the lapse of time when a bending stress is applied to a polarization maintaining type optical fiber.

FIG. 7 is the configuration diagram of a system for measuring how the fixed point detection position changes with the lapse of time when a bending stress is applied to the polarization maintaining type optical fiber 45 in the fixed point detection apparatus 40 of the present embodiment. In FIG. 7, a unit composed of the light source 42, the polarizing plate 43 and the condenser lens 44 of the fixed point detection apparatus 40 in FIG. 5 is supposed to be a light incident unit 55 for entering a linearly polarized light having a predetermined extinction ratio into the optical fiber 45. The light incident unit 55 enters a linearly polarized light having an extinction ratio of 12 dB or a linearly polarized light having an extinction ratio of 29 dB into the polarization maintaining type optical fiber 45. At this time, it is measured how the bending radius and the detection position of the optical fiber 45 shift with time to the fixed point detected based on the two diffracted lights from the boundary portion 50 on the two diffraction gratings 48 and 49 attached to a scale 51.

For this reason, the measurement system includes an encoder 56 attached to the scale 51 for detecting an analog positional shift quantity as digital data, an interpolation circuit 57 performing the interpolation of a predetermined number to a digital value from the encoder 56, and a personal computer (PC) 58 totalizing the positional shift data of the fixed point detection position. A comparison result from the comparator 54 of the fixed point detection apparatus 40 is also supplied to the personal computer 58.

Figure 8:
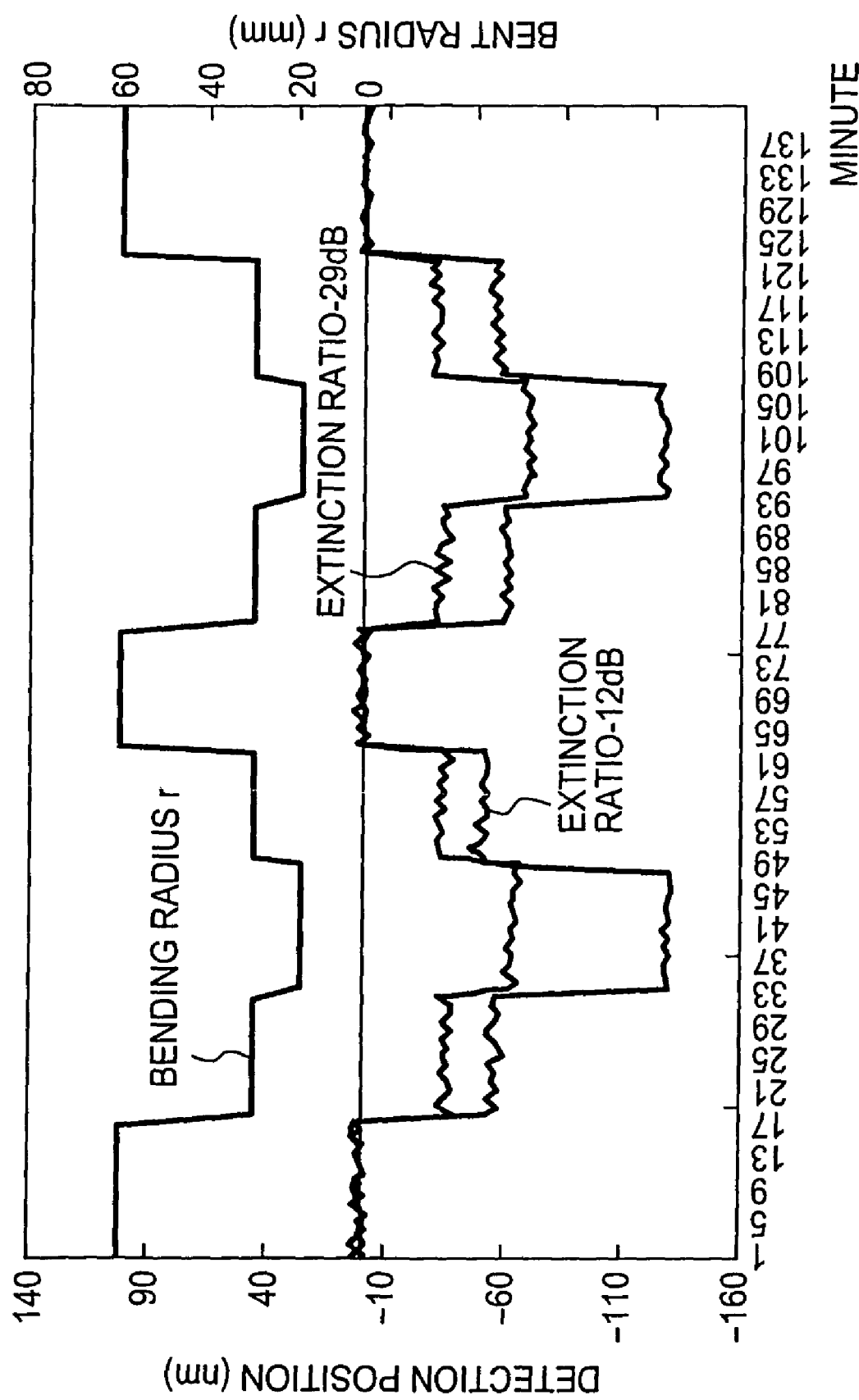
FIG. 8 is a characteristic diagram showing the shifts of a fixed point detection position caused by the bending of a fiber.

FIG. 8 is a characteristic diagram showing the shifts of a fixed point detection position caused by the fiber bending. The abscissa axis indicates time (minutes). The ordinate axis on the left side indicates a detection position (nm), and the ordinate axis on the right side indicates a bending radius (mm) of the optical fiber.

First, it is supposed that a fixed point position detected by the fixed point detection apparatus 40 in a case where the bending radius is set to 60 (mm) is zero. If the light incident unit 55 enters the linearly polarized-lights having extinction ratios of 12 dB and 29 dB into the optical fiber 45, the fixed point positions of the lights are not shifted until 18 minutes has elapsed (hereinafter referred to as a first state). For a period of the elapsed time from 18 minutes to 32 minutes the bending radius of the optical fiber 45 becomes 28 (mm) (hereinafter referred to as a second state). If the light incident unit 55 enters the linearly polarized light having the extinction ratio of 12 dB into the optical fiber 45 in the second state, the fixed point detected by the fixed point detection apparatus 40 is shifted by −60 (nm). On the other hand, if the linearly polarized light having the extinction ratio of 29 dB is entered into the optical fiber 45 in the second state, the shift of the fixed point detected by the fixed point detection apparatus 40 results in only −35 (nm).

For a period of the elapsed time from 32 minutes to 48 minutes the bending radius of the optical fiber 45 becomes 18 (mm) (hereinafter referred to as a third state). If the light incident unit 55 enters the linearly polarized light having the extinction ratio of 12 dB into the optical fiber 45 in the third state, the fixed point detected by the fixed point detection apparatus 40 is shifted by −130 (nm). On the other hand, if the linearly polarized light having the extinction ratio of 29 dB is entered into the optical fiber 45 in the third state, the shift of the fixed point detected by the fixed point detection apparatus 40 results in only −62 (nm).

For a period of the elapsed time from 48 minutes to 63 minutes the bending radius of the optical fiber 45 becomes 28 (mm) (hereinafter referred to as a fourth state). If the light incident unit 55 enters the linearly polarized light having the extinction ratio of 12 dB into the optical fiber 45 in the fourth state, the fixed point detected by the fixed point detection apparatus 40 is shifted by −58 (nm). On the other hand, if the linearly polarized light having the extinction ratio of 29 dB is entered into the optical fiber 45 in the fourth state, the shift of the fixed point detected by the fixed point detection apparatus 40 results in only −35 (nm).

For a period of the elapsed time from 63 minutes to 78 minutes the bending radius of the optical fiber 45 becomes 60 (mm) (hereinafter referred to as a fifth state). If the light incident unit 55 enters the linearly polarized light having the extinction ratio of 12 dB into the optical fiber 45 in the fifth state, the fixed point detected by the fixed point detection apparatus 40 is shifted by 0 (nm) similarly to the first state. Moreover, even if the linearly polarized light having the extinction ratio of 29 dB is entered into the optical fiber 45 in the fifth state, the fixed point detected by the fixed point detection apparatus 40 becomes 0 (nm) similarly.

For a period of the elapsed time from 78 minutes to 93 minutes the bending radius of the optical fiber 45 becomes 28 (mm) (hereinafter referred to as a sixth state). If the light incident unit 55 enters the linearly polarized light having the extinction ratio of 12 dB into the optical fiber 45 in the sixth state, the fixed point detected by the fixed point detection apparatus 40 is shifted by −60 (nm). On the other hand, if the linearly polarized light having the extinction ratio of 29 dB is entered into the optical fiber 45 in the sixth state, the shift of the fixed point detected by the fixed point detection apparatus 40 results in only −35 (nm).

For a period of the elapsed time from 93 minutes to 108 minutes the bent radius of the optical fiber 45 becomes 18 (mm) (hereinafter referred to as a seventh state). If the light incident unit 55 enters the linearly polarized light having the extinction ratio of 12 dB into the optical fiber 45 in the seventh state, then the fixed point detected by the fixed point detection apparatus 40 is shifted by −13 (nm) similarly to the third state. On the other hand, if the linearly polarized light having the extinction ratio of 29 dB is entered into the optical fiber 45 in the seventh state, then the shift of the fixed point detected by the fixed point detection apparatus 40 results in only −62 (nm) similarly to the third state.

For a period of the elapsed time from 108 minutes to 123 minutes the bending radius of the optical fiber 45 becomes 28 (mm) (hereinafter referred to as an eighth state). If the light incident unit 55 enters the linearly polarized light having the extinction ratio of 12 dB into the optical fiber 45 in the eighth state, the fixed point detected by the fixed point detection apparatus 40 is shifted by −60 (nm) similarly to the sixth state. On the other hand, if the linearly polarized light having the extinction ratio of 29 dB is entered into the optical fiber 45 in the eighth state, the shift of the fixed point detected by the fixed point detection apparatus 40 results in only −35 (nm) similarly to the sixth state.

For a period of the elapsed time from 123 minutes to 137 minutes the bending radius of the optical fiber 45 becomes 60 (mm) (hereinafter referred to as a ninth state). If the light incident unit 55 enters the linearly polarized light having the extinction ratio of 12 dB into the optical fiber 45 in the ninth state, the fixed point detected by the fixed point detection apparatus 40 is shifted by 0 (nm) similarly to the first state. Moreover, even if the linearly polarized light having the extinction ratio of 29 dB is entered into the optical fiber 45 in the fifth state, the fixed point detected by the fixed point detection apparatus 40 becomes 0 (nm) similarly.

That is, in the case where bending stresses are applied to the optical fiber 45, if the linearly polarized light having the extinction ratio of 29 dB higher than the extinction ratio of 12 dB is entered into the optical fiber 45 with the light incident unit 55, then it is found that the positional shift of the fixed point is little, and the effect acquired by the application of the present embodiment is clear.

Figure 9:
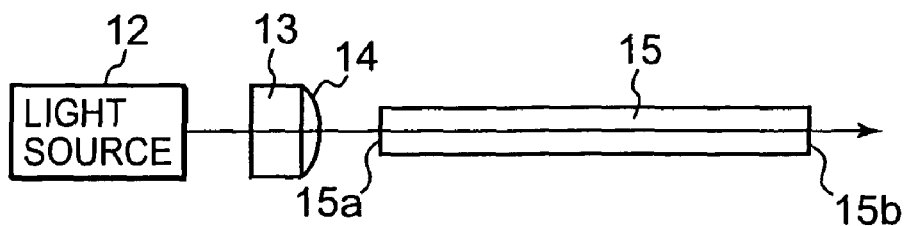
FIG. 9 is a view showing an optical transmission unit made of a polarizing plate and a condenser lens which are integrated with each other.

The following specific examples can be used as the optical transmission units 11 and 41 used in the displacement measurement apparatus 10 and the fixed point detection apparatus 40 in addition to the configurations shown in FIGS. 1 and 5. FIG. 9 shows an optical transmission unit integrating the polarizing plate and the condenser into one body. It is noted that, in each instantiation described with reference to FIGS. 9-13 hereinafter, each reference numeral used to denote the light source 12, the polarizing plate 13, the condenser lens 14, the polarization maintaining type optical fiber 15 and the optical transmission unit 11, each used in the displacement measurement apparatus 10, is used. It is of course that each specific example can be also use in the fixed point detection apparatus 40.

The light incident unit of the optical transmission unit 11 is the light incident unit 55 mentioned in FIG. 7 applied to the displacement measurement apparatus 10. The light incident unit is composed of the light source 12, the polarizing plate 13 and the condenser lens 14. In a case of devising the packaging the light incident unit of the optical transmission unit 11, it is necessary to reduce the number of parts. By integrating the polarizing plate 13 and the condenser lens 14 into one body, the number of parts can be reduced. It is of course that the following processing can be performed with the optical transmission unit 11 of FIG. 9. That is, a beam from the light source 12 is changed to a linearly polarized light having a high extinction ratio with the polarizing plate 13. Furthermore, the beam is condensed by the condenser lens 14. Thus, the polarization axis of the beam is adjusted to the optical axis 34 of the polarization maintaining type optical fiber 15, and the beam is entered into the incident end 15a of the optical fiber 15. Consequently, the beam outgoing from the exit end 15b of the optical fiber 15 has a high extinction ratio, and the changes of the extinction ratio caused by the bending and the stress of the optical fiber results in being small.

Figure 10:
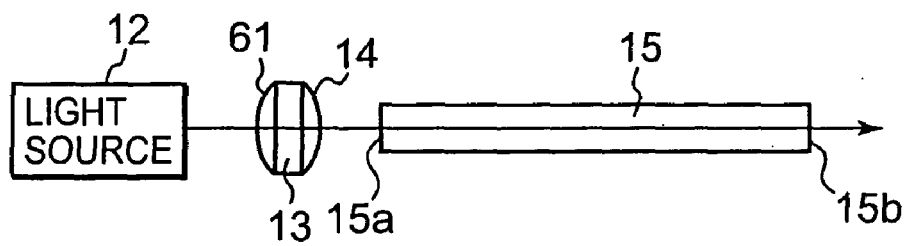
FIG. 10 is a view showing an optical transmission unit made of a polarizing plate integrally put between a collimator lens and a condenser lens.

FIG. 10 shows the optical transmission unit 11 including the polarizing plate 13 put between a collimator lens 61 and the condenser lens 14 to be integrate to one body. In this specific example, a beam from the light source 12 is made to parallel lights by the collimator lens 61 to enter the polarizing plate 13 perpendicularly. Consequently, the performance of the polarizing plate 13 can be fully exhibited. Also by the specific example the number of parts can be reduced at the time of packaging. It is of course that the beam emitted from the exit end 15b of the optical fiber 15 has a high extinction ratio, and the changes of the extinction ratio owing to the bending and the stress of the optical fiber 15 results in being little. It is noted that this specific example may be modified so that the collimator lens 61, the polarizing plate 13 and the condenser lens 14 re separately disposed without being integrated into one body.

Figure 11:
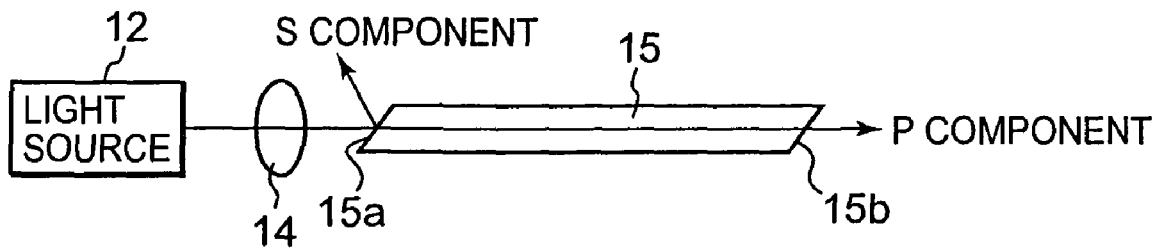
FIG. 11 is a view showing an optical transmission unit including a polarization maintaining type optical fiber with an incident end face formed to take a Brewster angle in place of the polarizing plate.

FIG. 11 shows the optical transmission unit 11 forming the incident end face 15a of the polarization maintaining type optical fiber 15 to be form the Brewster angle in place of the polarizing plate without using the polarizing plate. By forming the incident end face 15a of the optical fiber 15 to be form the Brewster angle, the S polarization component is reflected and the P polarization component is entered into the core 30 in the optical fiber 15 on the interface similarly to the function of a polarizing filter. That is, only the P polarization component can be entered into the optical fiber 15. The beam emitted from the light source 12 enters only the P polarization component into the optical fiber 15 having the incident end face 15a formed in the Brewster angle through the condenser lens 14. The S polarization component is reflected as shown by an arrow in FIG. 11 by the incident end face 15a formed in the Brewster angle, and is not allowed to enter the core 30 of the optical fiber 15. Consequently, it results in the entering of the beam having the high extinction ratio. Therefore, also in the specific example, the following operation can be performed. That is, the beam from the light source 12 is changed to the linearly polarized light having the high extinction ratio, and the beam is condensed by the condenser lens 14. Then, the polarization axis of the beam is adjusted to the optical axis 34 of the polarization maintaining type optical fiber 15 to be entered into the optical fiber 15. Consequently, the beam emitted from the exit end 15b of the optical fiber 15 has a high extinction ratio, and the changes of the extinction ratio caused by the bending and the stress of the optical fiber 15 results in being little. Moreover, because it is possible not to use the polarization element, the packaging space of the unit can be improved at the time of the packaging thereof.

In addition, in FIG. 11, the incident end face 15a of the polarization maintaining type optical fiber 15 may be formed by multilayer film processing, and all of the interfaces of the multilayer films may be formed to form the Brewster angle. According to such arrangement, it is possible to reflect the S polarization component and to enter the P polarization component into the core 30 of the optical fiber 15 at the interface similarly to the function of the polarizing filter. That is, it is possible to enter only the beam having the P polarization component into the optical fiber 15. Moreover, the incident end face 15a of the optical fiber 15 may be formed to be a polarization beam splitter.

Figure 12:
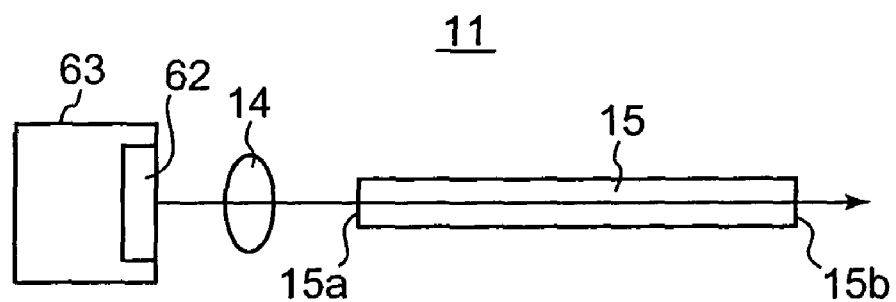
FIG. 12 is a view showing an optical transmission unit including the polarizing plate at the exit window of a semiconductor laser used as a light source.

FIG. 12 shows the optical transmission unit 11 having a polarizing plate 62 formed in the exit window of a semiconductor laser 63 used as the light source. Although the beam emitted by the semiconductor laser 63 has an extinction ratio of about 20 dB, the extinction ratio can be made to be about 30 dB by the polarizing plate 62 formed in the exit window. Because it is possible not to use the polarization element in the outer space of the semiconductor laser 63, the specific example also can attain the saving of space at the time of packaging. It is of course that the beam emitted from the exit end 15b of the optical fiber 15 has a high extinction ratio and the changes of the extinction ratio caused by the bending and the stress of the optical fiber results in being little.

Figure 13:
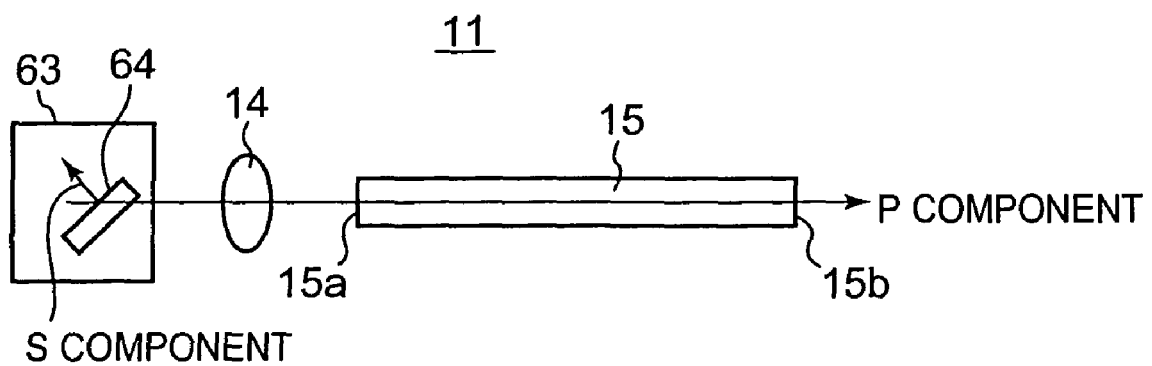
FIG. 13 is a view showing an optical transmission unit including an exit window glass of a semiconductor laser used as the light source which window glass is formed in a Brewster angle.

FIG. 13 shows the optical transmission unit 11 having the exit window glass 64 of a semiconductor laser 63 used as the light source to form the Brewster angle. This semiconductor laser 63 has the exit window thereof formed to be aslant in order to prevent the generation of astigmatism caused by spread angles of the beam different in the vertical direction and in the lateral direction. By forming the window glass 64 thereof formed to be aslant to form the Brewster angle, it is possible to reflect the S polarization component and to enter the P polarization component into the core 30 of the optical fiber 15 at the interface similarly to the function of the polarizing filter. That is, it is possible to enter only the beam having the P polarization component into the optical fiber 15. The P polarization component emitted from the semiconductor laser 63 enters the optical fiber 15 through the condenser lens 14. Because the S polarization component is not allowed to enter the optical fiber 15, it results in the entering of the beam having the high extinction ratio. Therefore, also in the specific example, the following operation can be performed. That is, the beam from the semiconductor laser 63 is changed to the linearly polarized light having the high extinction ratio, and the beam is condensed by the condenser lens 14. Then, the polarization axis of the beam is adjusted to the optical axis 34 of the polarization maintaining type optical fiber 15 to be entered into the optical fiber 15. Consequently, the beam emitted from the exit end 15b of the optical fiber 15 has a high extinction ratio, and the changes of the extinction ratio caused by the bending and the stress of the optical fiber 15 results in being little. Moreover, because it is possible not to use the polarization element in the outside of the semiconductor laser 63, the packaging space of the unit can be improved at the time of the packaging thereof.

Moreover, in FIG. 13, the window glass 64 of the semiconductor laser 63 may be formed by multilayer film processing, and all of the interfaces of the multilayer films may be formed to form the Brewster angle. According to such formation, it is possible to reflect the S polarization component and to enter the P polarization component into the core 30 of the optical fiber 15 at the interface similarly to the function of the polarizing filter. That is, it is possible to enter only the beam having the P polarization component into the optical fiber 15.

It is noted that the application of the present invention is not limited only to the displacement measurement apparatus 10 and the fixed point detection apparatus 40. The present invention can be applied to an apparatus for detecting a displacement by an optical formula based on the configuration of at least including: a light source, extinction ratio conversion means, a condenser lens, a polarization maintaining type optical fiber, a diffraction grating, and light receiving means. In the apparatus, each element is configured as follows. The light source emits a light. The extinction ratio conversion means raises an extinction ratio of the light emitted from the light source to 20 dB or more. The condenser lens condenses the light having the extinction ratio made to be 20 dB or more by the extinction ratio conversion means. The polarization maintaining type optical fiber transmits the light condensed by the condenser lens. The diffraction grating is attached to a measurement object and subjected to an irradiation of the light transmitted by the optical fiber to diffract the irradiated light. The light receiving means receives the light diffracted by the diffraction grating. With this configuration, the apparatus adjusts a polarization axis of the light to an optical axis of the optical fiber or an axis perpendicular to the optical axis to enter the light into the optical fiber, the light having the extinction ratio raised to 20 dB or more by the extinction ratio conversion means and being condensed by the condenser lens. The apparatus detects a displacement of the measurement object based on a magnitude of a received light quantity of the diffracted light received by the light receiving means. For example, such an apparatus includes a transmission type displacement detection apparatus, a reflection type displacement detection apparatus, a transmission type displacement measurement apparatus, a transmission type fixed point detection apparatus and the like.

It is of course that the extinction ratio conversion means may be a polarization element. Moreover, the polarization element functioning as the extinction ratio conversion means may be integrated with the condenser lens to be one body.

Moreover, by forming the incident side end face of the optical fiber to form a Brewster angle, the end face may be used as the extinction ratio conversion means.

Moreover, by using the semiconductor laser as the light source, the polarization element may be formed in the exit window glass of the semiconductor laser.

Moreover, the extinction ratio conversion means may be a polarization beam splitter. Moreover, by using the semiconductor laser as the light source, the polarization beam splitter may be formed on the exit window glass of the semiconductor laser.

Moreover, by using a semiconductor laser as the light source, and by forming the exit window glass of the semiconductor laser to form the Brewster angle, the exit window glass may be used as the extinction ratio conversion means. Moreover, by forming the light incident side end face of the optical fiber as a polarization beam splitter, the incident side end face may be used as the extinction ratio conversion means.

In the above description, the displacement measurement apparatus 10 and 200 and the fixed point detection apparatus 40 are configured to change beams from the light sources 12 and 42 to linearly polarized lights having high extinction ratios of 20 dB or more by passing the beams through the polarizing plates 13 and 42 before condensing the linearly polarized lights with the condenser lenses 14 and 44 to pass the condensed lights through the polarization maintaining type optical fibers 15 and 45.

Figure 14:
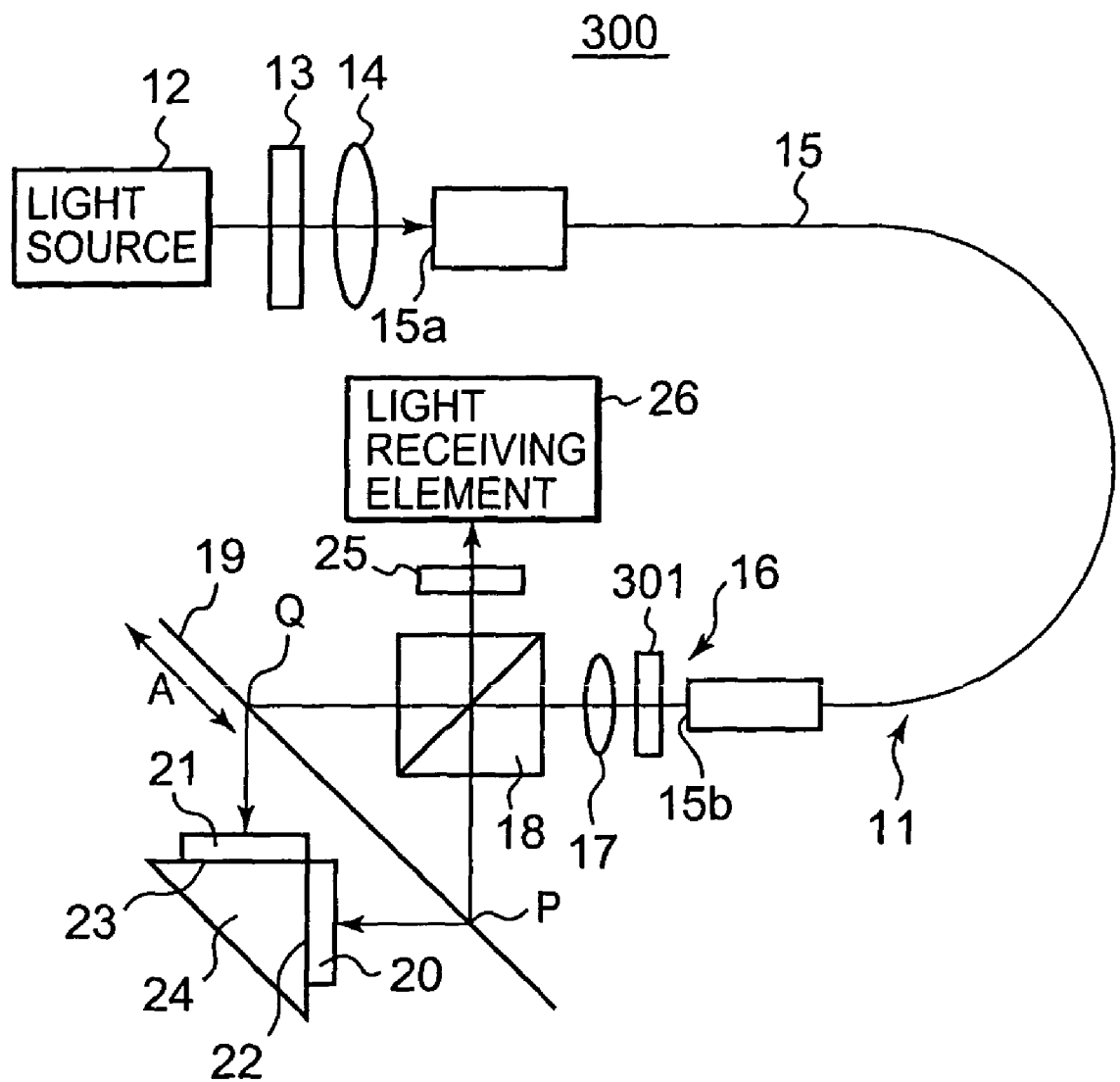
FIG. 14 is the configuration diagram of a displacement measurement apparatus further equipped with a depolarization element.

Furthermore, in order to further decrease the disturbance of polarization caused by the bending and the stress of the optical fiber to realize a further highly accurate displacement detection, a displacement measurement apparatus 300 shown in FIG. 14 may be used.

The displacement measurement apparatus 300 is configured to include a depolarization element 301 which changes the polarization of a beam transmitted from the optical fiber 15 to the state of being unpolarized between the exit end 15b and the condenser lens 17 on the exit end side of the optical fiber 11 of the displacement measurement apparatus 10 shown in FIG. 1.

Figure 15:
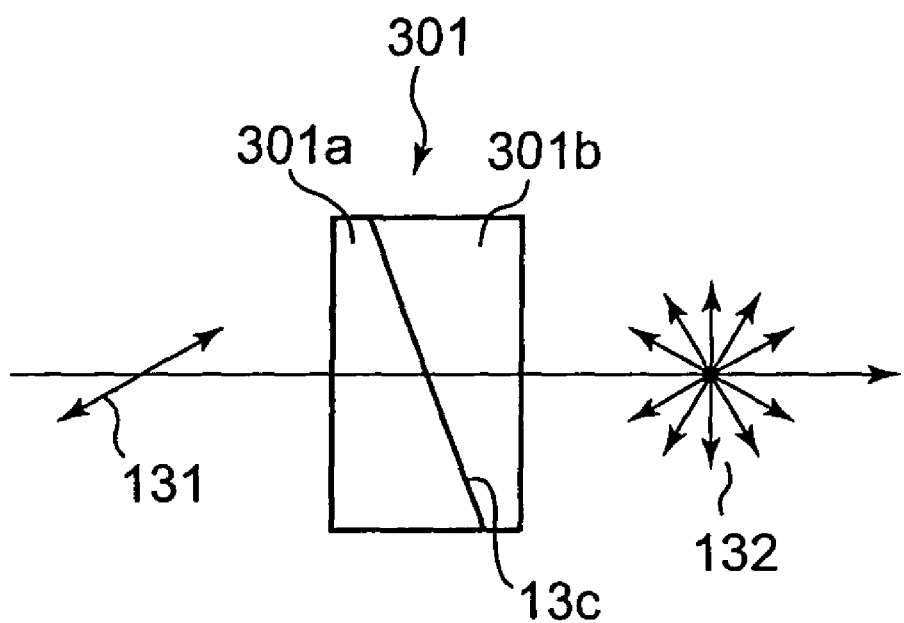
FIG. 15 is a sectional view of the depolarization element.

The depolarization element 301 cancels the polarization of a beam transmitted by and emitted from the optical fiber 15. The material of the depolarization element 301 is crystal, mica or an organic resin. Here, a specific example of the depolarization element 301 is described with reference to FIG. 15. The depolarization element 301 having a cross section shown in FIG. 15 is made by cutting a crystal 301a and a silica glass 301b aslant, and by adhering them with a transparent adhesive at an oblique line 301c. Alternatively, the mica or the organic resin may be used as the material. Even if an incident light is, for example, a linearly polarized light 131, the thicknesses of the crystal 301a and the silica glass 301b are different from each other along the oblique line 301c, and the thicknesses become $\lambda/4$, $2\lambda/4$, $3\lambda/4$ according to the positions on the oblique line 301c. For this reason, if a light flux has a width of, for example, about 1 mm, the light which has refracted by the silica glass 301b and comes out from the silica glass 301b becomes an unpolarized random light 132. By the principle, the depolarization element 301 can change a laser light having a fixed polarization direction into an unpolarized light such as a natural light, i.e. a random light.

The condenser lens 17 condenses the beam made to be unpolarized by the depolarization element 301, and enter the condensed light into the polarization beam splitter 18.

As described above, because the displacement measurement apparatus 300 provides the depolarization element 301 between the exit end 15b of the optical fiber 15 and the condenser lens 17, the displacement measurement apparatus 300 can further decrease the disturbance of polarization caused by the bending and the stress of the optical fiber 15 in comparison with the displacement measurement apparatus 10. Moreover, the displacement measurement apparatus 300 enables a further highly precise displacement detection.

Figure 16:
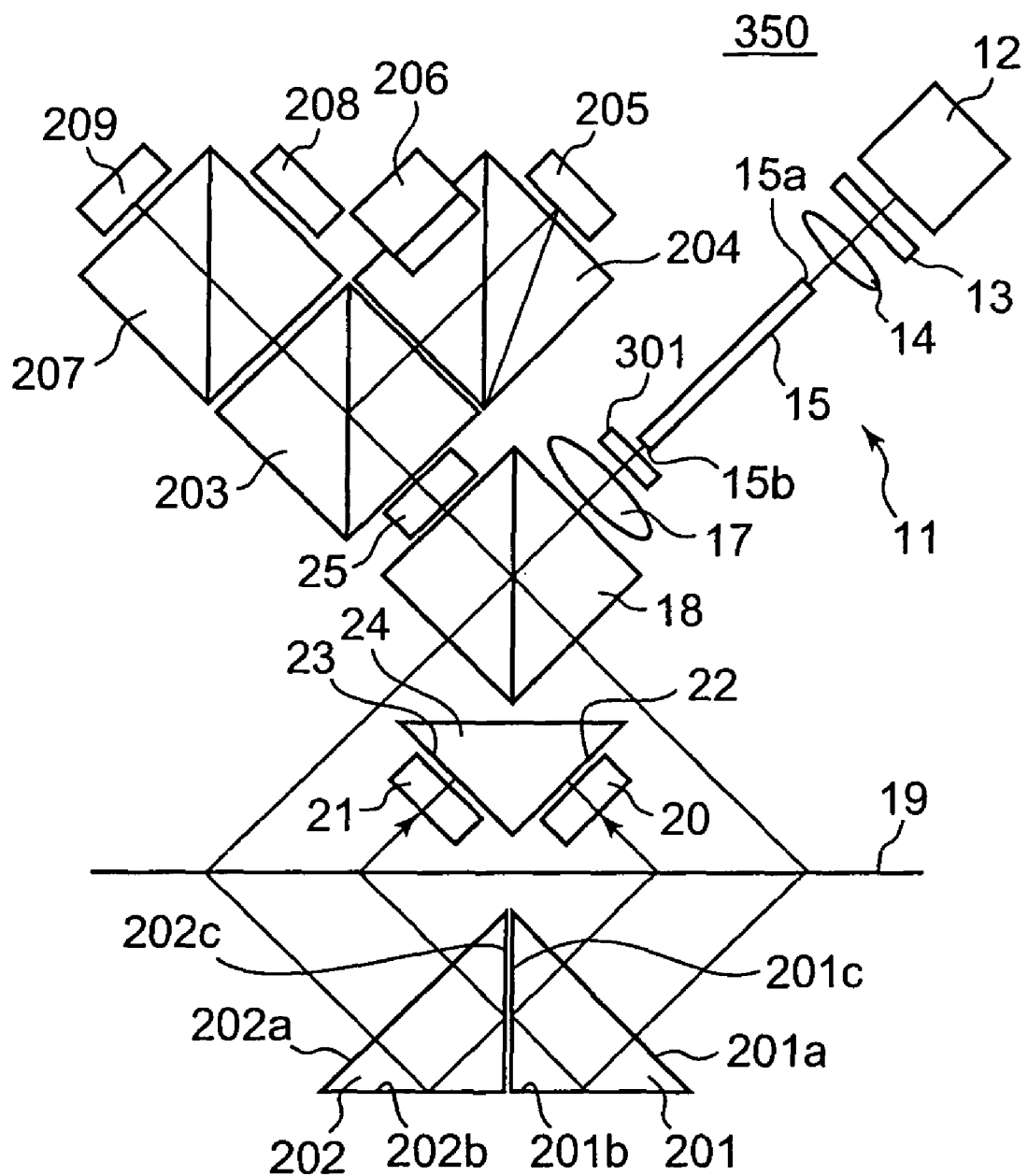
FIG. 16 is the configuration diagram of an application example of the displacement measurement apparatus further including a depolarization element.

Similarly, FIG. 16 shows a displacement measurement apparatus 350 configured to have the depolarization element 301 disposed between the exit end 15b and the condenser lens 17 on the exit end side of the optical fiber 15 of the displacement measurement apparatus 200 shown in FIG. 4. Because the displacement measurement apparatus 350 also has the depolarization element 301 disposed between the exit end 15b of the optical fiber 15 and the condenser lens 17, the displacement measurement apparatus 350 can further decrease the disturbance of polarization caused by the bending and the stress of the optical fiber 15 in comparison with the displacement measurement apparatus 200. Moreover, the displacement measurement apparatus 350 enables a further highly precise displacement detection.

Figure 17:
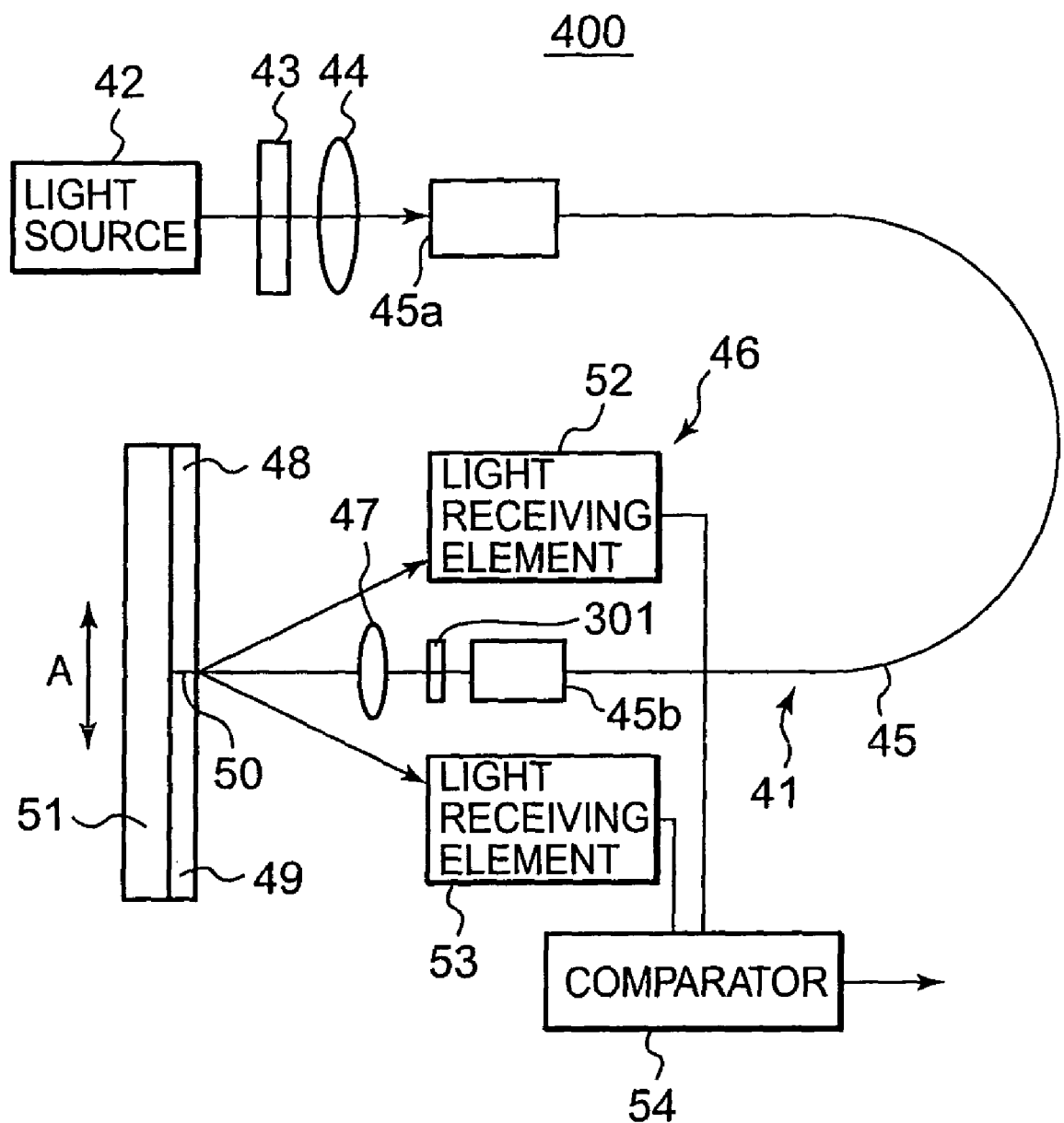
FIG. 17 is the configuration diagram of an application example of a fixed point detection apparatus further including a depolarization element.
Figure 18:
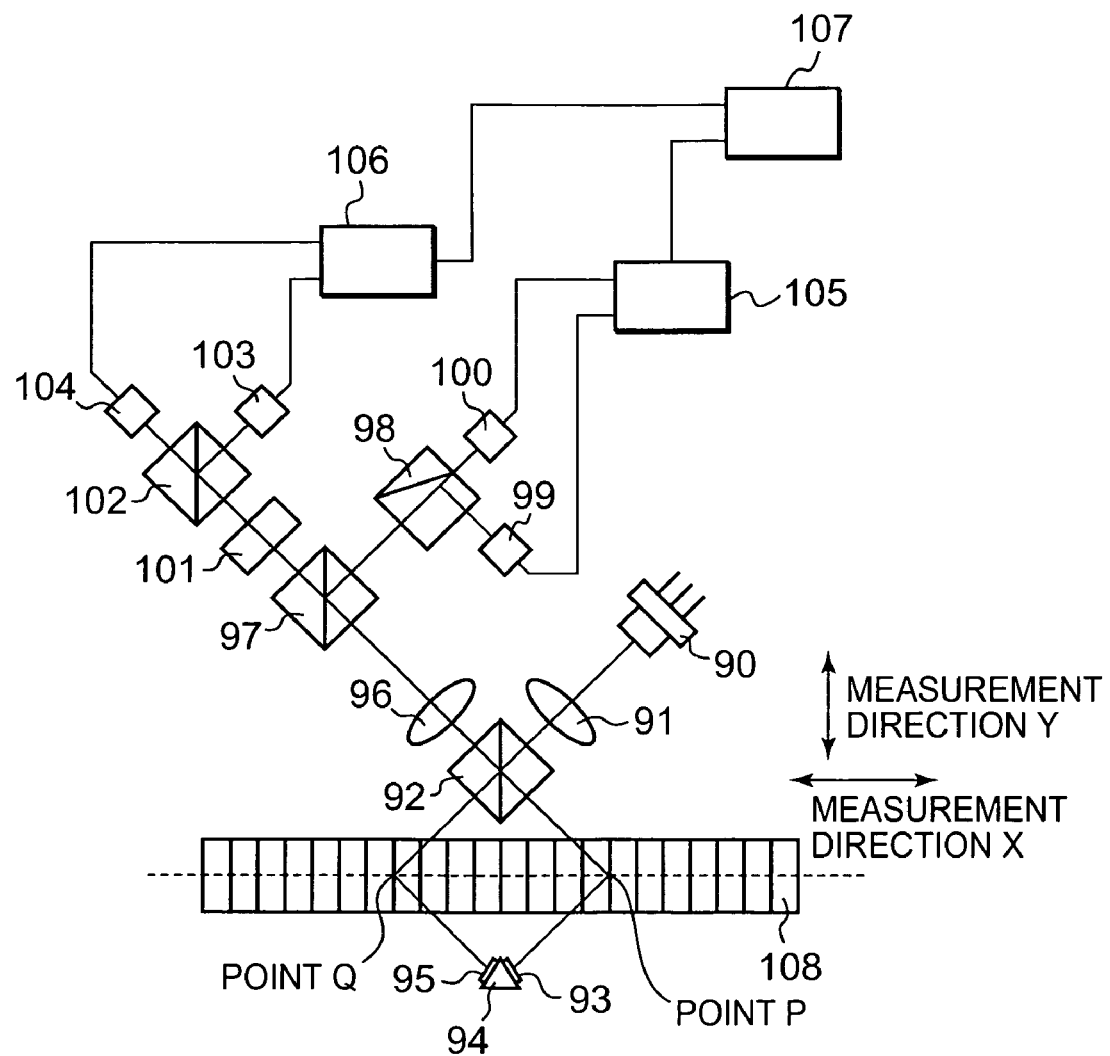
FIG. 18 is the configuration diagram of a related art displacement detection apparatus.
Figure 19:
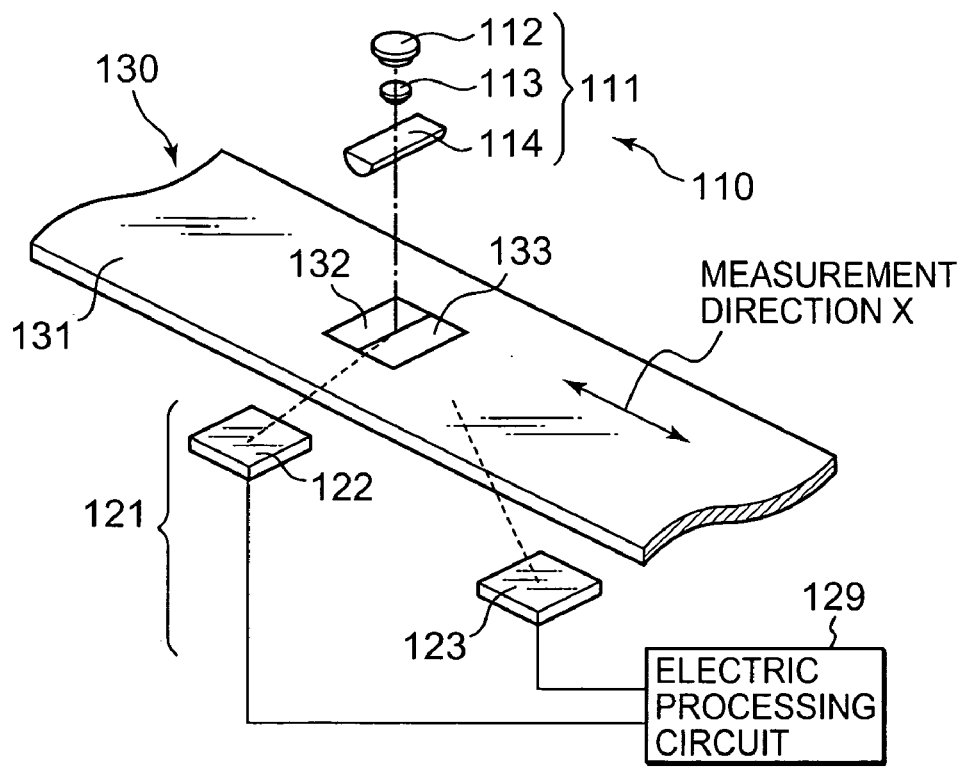
FIG. 19 is the configuration diagram of a related art fixed point detection apparatus.
Figure 20:
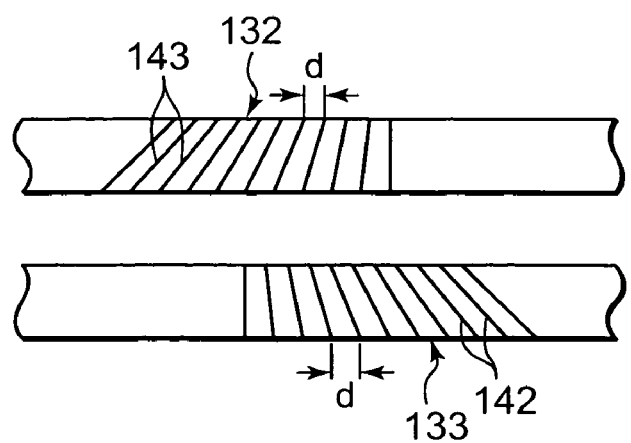
FIG. 20 is a view showing a holographic diffraction configuration used in the fixed point detection apparatus shown in FIG. 19.
Figure 21:
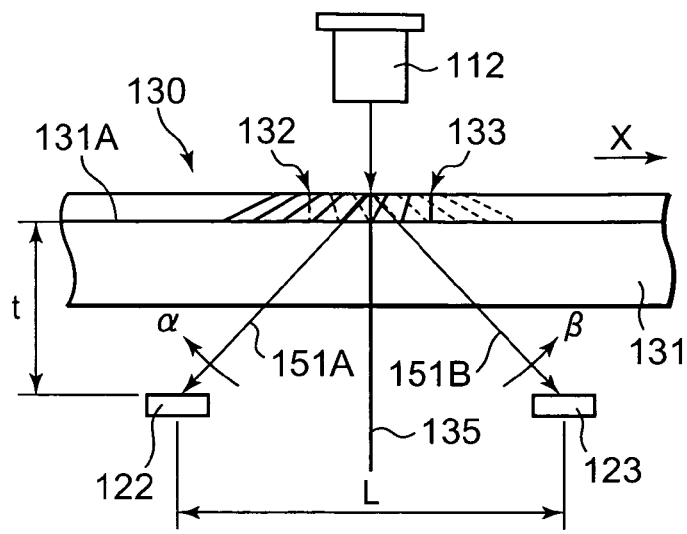
FIG. 21 is a view showing a principal part of the fixed point detection apparatus shown in FIG. 19.
Figure 22:
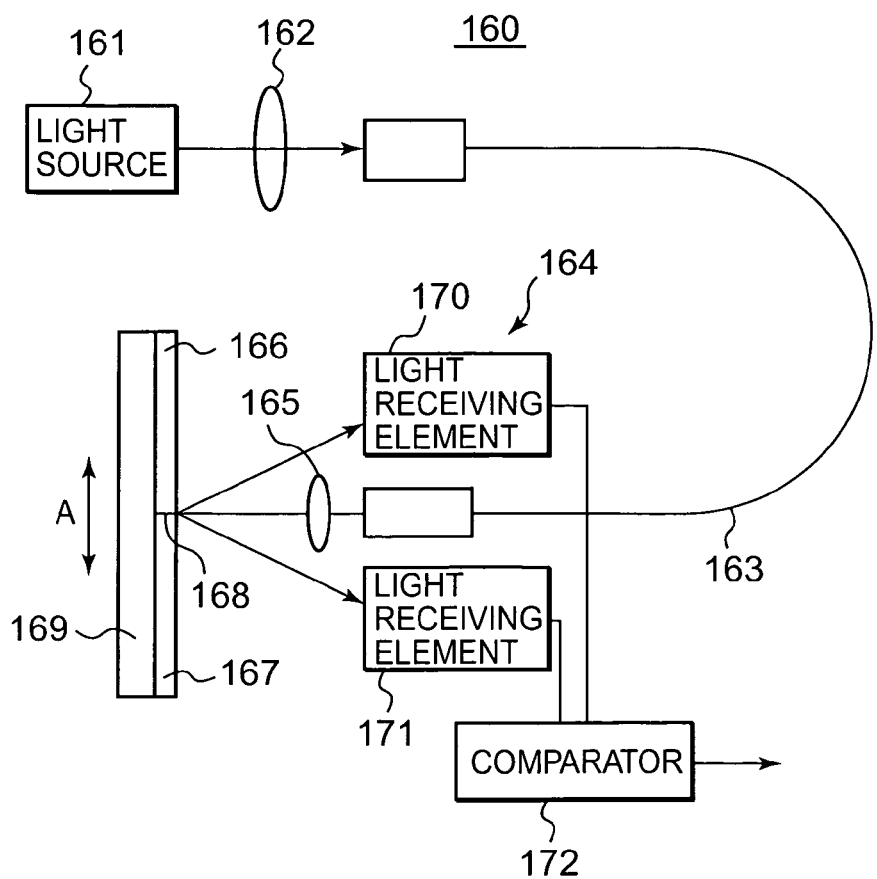
FIG. 22 is a configuration diagram of a related art fixed point detection apparatus detecting a fixed point using an optical fiber.
Figure 23:
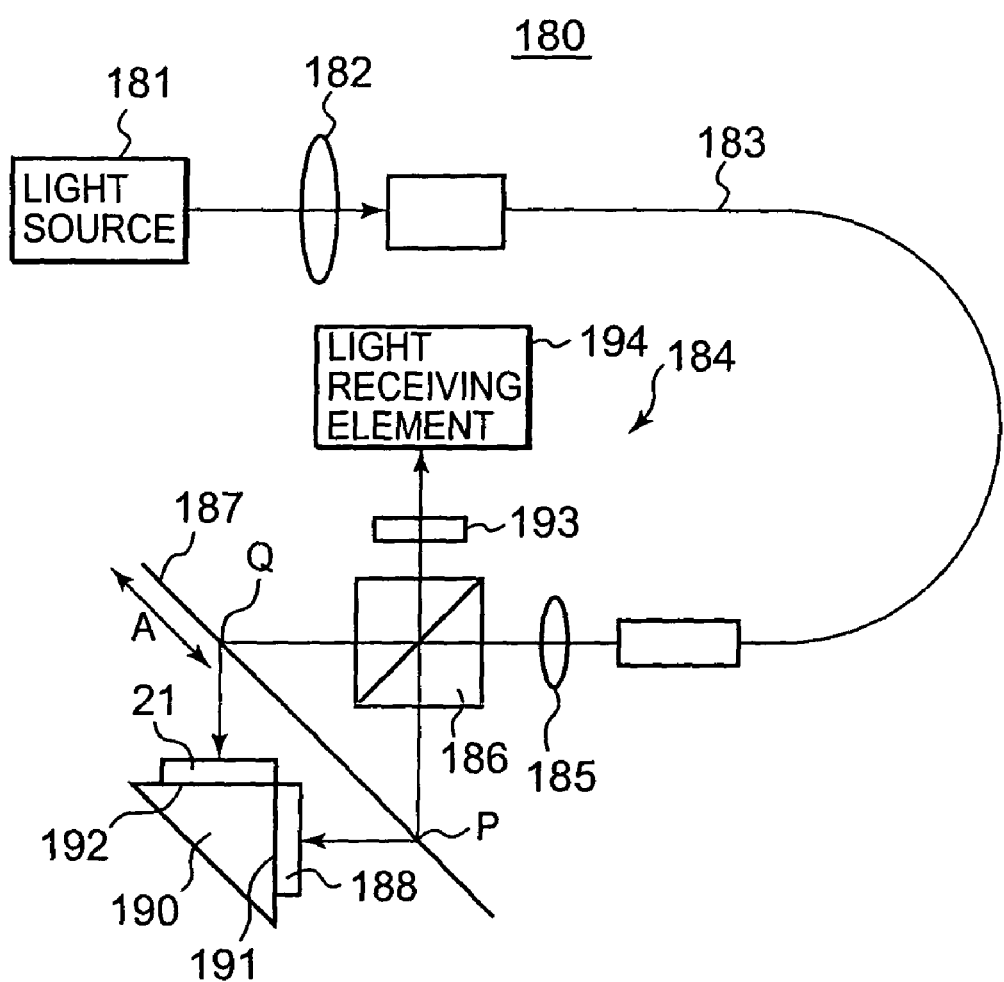
FIG. 23 is a configuration diagram of a related art displacement measurement apparatus measuring a displacement using an optical fiber.

Similarly, FIG. 17 shows a fixed point detection apparatus 400 configured to have the depolarization element 301 disposed between the exit end 45b of the optical fiber 45 and the condenser lens 47 in the fixed point detection apparatus 40 shown in FIG. 5. Because the fixed point detection apparatus 400 also provides the depolarization element 301 between the exit end 45b of the optical fiber 45 and the condenser lens 47, the fixed point detection apparatus 400 can further decrease the disturbance of polarization caused by the bending and the stress of the optical fiber 45 in comparison with the fixed point detection apparatus 40. Moreover, the fixed point detection apparatus 400 enables a further highly precise fixed point detection.

It should be understood by those skilled in the art that various modifications, combinations, sub-combinations and alterations may occur depending on design requirements and other factors insofar as they are within the scope of the appended claims or the equivalents thereof.

What is claimed is:

1. A displacement detection apparatus comprising:
a light source which emits a light;
an extinction ratio conversion means which raises an extinction ratio of the light emitted from said light source to 20 dB or more;
a condenser lens which condenses the light having the extinction ratio made to be 20 dB or more by said extinction ratio conversion means, wherein the light source directly feeds into a collimator lens at first side of a polarization element operating as the extinction ratio conversion means and the condenser lens is located at the second side of the polarization element;
a polarization maintaining type optical fiber which transmits the light condensed by said condenser lens;
a depolarization element which depolarizes the light transmitted by said optical fiber, wherein the depolarization element cancels a polarization of a beam transmitted by and emitted from the optical fiber, the depolarization element being located between an exit end of the polarization maintaining optical fiber and a further condenser lens;
a diffraction grating subjected to an irradiation of the light depolarized by said depolarization element, said diffraction grating attached to a measurement object; and
light receiving means which receives the light diffracted by said diffraction grating, wherein:
said displacement detection apparatus matches a polarization axis of the light to an optical axis of said optical fiber or an axis perpendicular to the optical axis to enter the light into said optical fiber, the light having the extinction ratio raised to 20 dB or more by said extinction ratio conversion means and being condensed by said condenser lens, and detects a displacement of the measurement object based on a magnitude of a received light quantity of the diffracted light received by said light receiving means.

2. The displacement detection apparatus according to claim 1, wherein said depolarization element is a depolarization plate made of crystal, mica or an organic resin.

3. A displacement measurement apparatus comprising:
a light source which emits a light;
an extinction ratio conversion means which changes the light emitted from said light source to a linearly polarized light and raising an extinction ratio of the linearly polarized light to 20 dB or more;
a condenser lens which condenses the light having the extinction ratio made to be 20 dB or more by said extinction ratio conversion means, wherein the light source directly feeds into a collimator lens at first side of a polarization element operating as the extinction ratio conversion means and the condenser lens is located at the second side of the polarization element;
a polarization maintaining type optical fiber which transmits the light condensed by said condenser lens;
a depolarization element which depolarizes the light transmitted by said optical fiber, wherein the depolarization element cancels a polarization of a beam transmitted by and emitted from the optical fiber, the depolarization element being located between an exit end of the polarization maintaining optical fiber and a further condenser lens;
a polarization beam splitter which divides the light depolarized by said depolarization element into two parts;
a diffraction grating attached to a measurement object, which receives an incidence of the light divided into the two parts by said polarization beam splitter to acquire a diffracted light;
a phase plate which changes polarizations of the diffracted lights of the lights divided into the two parts by said diffraction grating;
two reflection mirrors each of which reflects the diffracted light having the polarization changed by said phase plate to guide the diffracted lights to the diffraction grating again through the phase plate;
a polarization element which makes the two diffracted lights interfere with each other, each of the diffracted lights guided to said diffraction grating by one of the two reflection mirrors, diffracted by said diffraction grating, entering said polarization beam splitter, and reflected and transmitted-by said polarization beam splitter; and
a light receiving element which receives an interfered light acquired by said polarization element, wherein:
said displacement measurement apparatus matches a polarization axis of the light to an optical axis of said optical fiber or an axis perpendicular to the optical axis to enter the light into said optical fiber, the light having the extinction ratio raised to 20 dB or more by said extinction ratio conversion means and being condensed by said condenser lens, and measures a displacement of the measurement object based on a magnitude of a received light quantity of the diffracted light received by said light receiving means.

4. A fixed point detection apparatus comprising:
a light source which emits a light;
an extinction ratio conversion means which changes the light emitted from said light source to a linearly polarized light and raises an extinction ratio of the linearly polarized light to 20 dB or more;
a condenser lens which condenses the light having the extinction ratio made to be 20 dB or more by said extinction ratio conversion means, wherein the light source directly feeds into a collimator lens at first side of a polarization element operating as the extinction ratio conversion means and the condenser lens is located at the second side of the polarization element;
a polarization maintaining type optical fiber which transmits the light condensed by said condenser lens;
a depolarization element which depolarizes the light transmitted by the optical fiber, wherein the depolarization element cancels a polarization of a beam transmitted by and emitted from the optical fiber, the depolarization element being located between an exit end of the polarization maintaining optical fiber and a further condenser lens;
two diffraction gratings disposed to mutually adjoin, said diffraction gratings subjected to an irradiation of the light depolarized by said depolarization element to diffract the light;

two light receiving means each of which receives the light diffracted by one of said two diffraction gratings; and comparison means which compares received light quantities of said two light receiving means, wherein:

said fixed point detection apparatus matches a polarization axis of the light to an optical axis of said optical fiber or an axis perpendicular to the optical axis to enter the light into said optical fiber, the light having the extinction ratio raised to 20 dB or more by said extinction ratio conversion means and being condensed by said condenser lens, and determines a fixed point based on a result of the comparison means' comparison of the received light quantities of the two light receiving means.

* * * * *